US005633813A

United States Patent [19]
Srinivasan

[11] Patent Number: 5,633,813
[45] Date of Patent: May 27, 1997

[54] APPARATUS AND METHOD FOR AUTOMATIC TEST GENERATION AND FAULT SIMULATION OF ELECTRONIC CIRCUITS, BASED ON PROGRAMMABLE LOGIC CIRCUITS

[76] Inventor: Seshan R. Srinivasan, 1524 Condor Way, Sunnyvale, Calif. 94087

[21] Appl. No.: 237,785

[22] Filed: May 4, 1994

[51] Int. Cl.$^6$ .................. G06F 11/263; G06F 9/455
[52] U.S. Cl. .................. 364/578; 364/488; 371/27; 395/500
[58] Field of Search .................. 364/488, 489, 364/490, 491, 578, 580; 324/73 R, 158 R, 73.1; 371/26, 23, 22.1, 25.1, 27; 437/51; 395/575, 500

[56] References Cited

U.S. PATENT DOCUMENTS

| | | | |
|---|---|---|---|
| 3,492,572 | 1/1970 | Endicott et al. | 324/73 |
| 3,961,250 | 6/1976 | Snethen | 324/73 R |
| 4,242,751 | 12/1980 | Henckels et al. | 371/26 |
| 4,862,399 | 8/1989 | Freeman | 364/580 |
| 4,937,765 | 6/1990 | Shupe et al. | 364/570 |
| 4,937,827 | 6/1990 | Beck et al. | 371/23 |
| 5,058,112 | 10/1991 | Namitz et al. | 371/3 |
| 5,177,440 | 1/1993 | Walker, III et al. | 324/158 R |
| 5,184,308 | 2/1993 | Nagai et al. | 364/489 |
| 5,253,181 | 10/1993 | Marui et al. | 364/489 |
| 5,257,268 | 10/1993 | Agrawal et al. | 371/27 |
| 5,353,289 | 10/1994 | Ohkawa | 371/23 |
| 5,384,275 | 1/1995 | Sakashita | 437/51 |
| 5,386,550 | 1/1995 | Yumioka et al. | 395/575 |
| 5,425,036 | 6/1995 | Liu et al. | 371/23 |
| 5,452,227 | 9/1995 | Kelsey et al. | 364/489 |

*Primary Examiner*—Kevin J. Teska
*Assistant Examiner*—Russell W. Frejd
*Attorney, Agent, or Firm*—Peter Chow

[57] ABSTRACT

An electronic circuit test vector generation and fault simulation apparatus is constructed with programmable logic devices (PLD) or field programmable gate array (FPGA) devices and messaging buses carrying data and function calls. A test generation and fault simulation (TGFS) comparator is implemented in the PLD or FPGA consisting of a partitioned sub-circuit configuration, and a multiplicity of copies of the same configuration each with a single and different fault introduced in it. The method for test vector generation involves determining test vectors that flag each of the fault as determined by a comparison of the outputs of the good and single fault configurations. Further the method handles both combinational as well as sequential type circuits which require generating a multiplicity of test vectors for each fault. The successful test vectors are now propagated to the inputs and outputs of the electronic circuit, through driver and receiver sub-circuits, modeled via their corresponding TGFS comparators, by means of an input/output/function messaging buses. A method of fault simulation utilizing the TGFS comparators working under a fault specific approach determines the fault coverage of the test vectors.

21 Claims, 15 Drawing Sheets

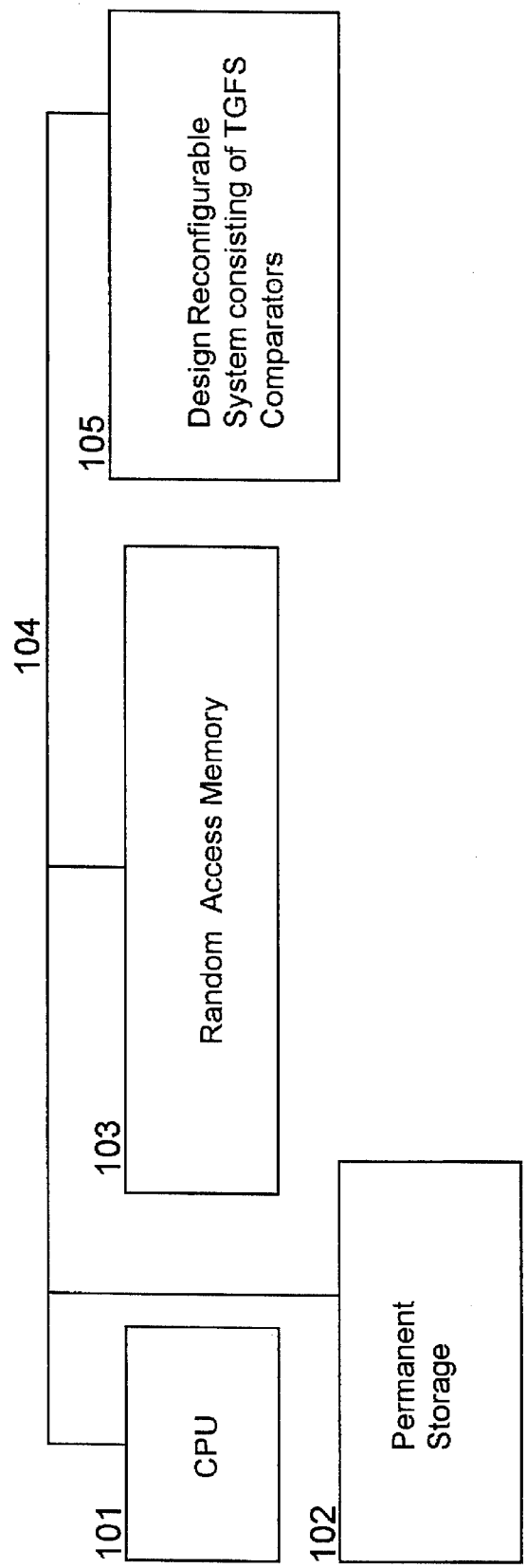
Fig 1 - Apparatus for Test Generation and Fault Simulation, of Electronic Circuit Designs.

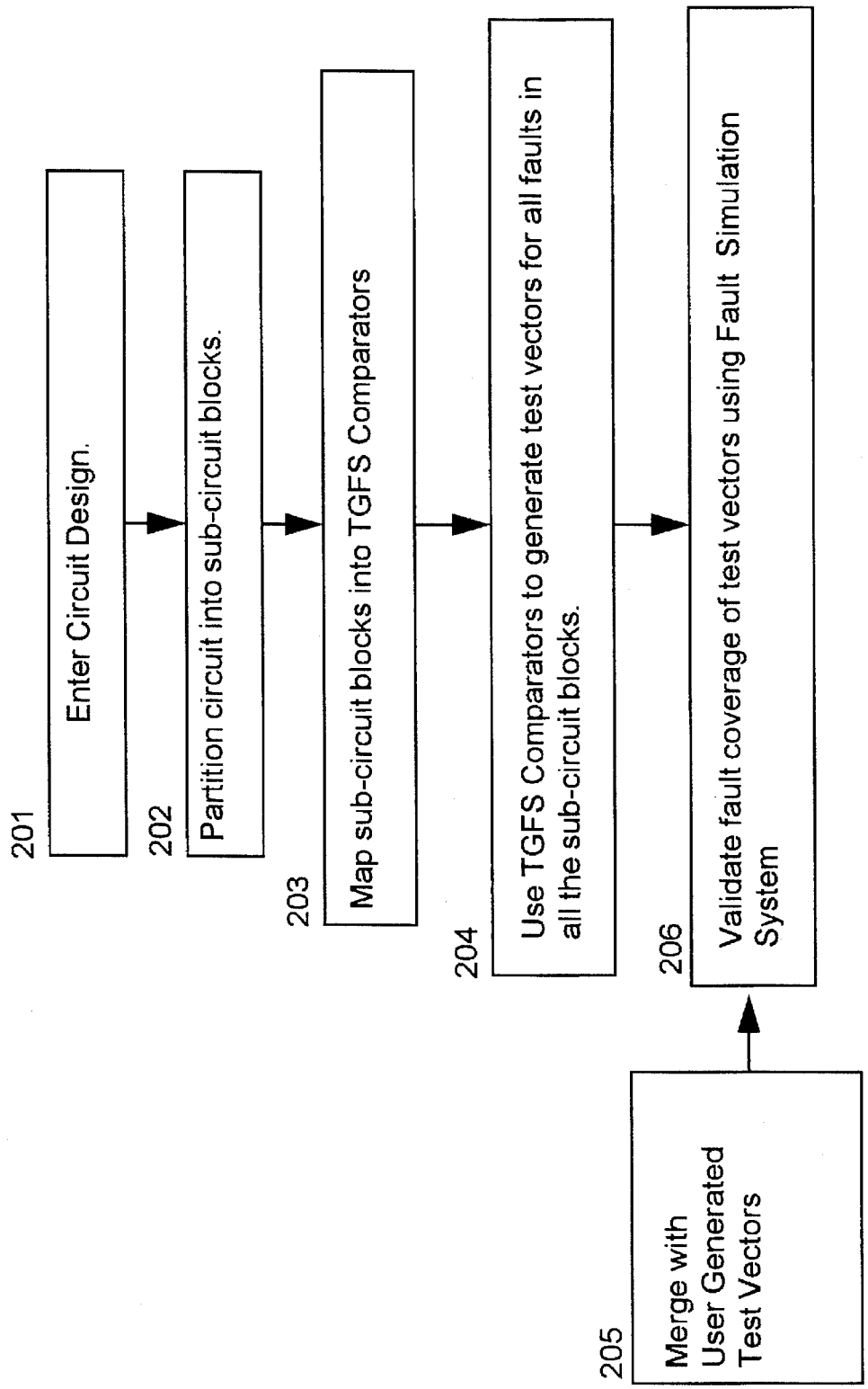
Fig 2 - Test Generation and Fault Simulation System Flow

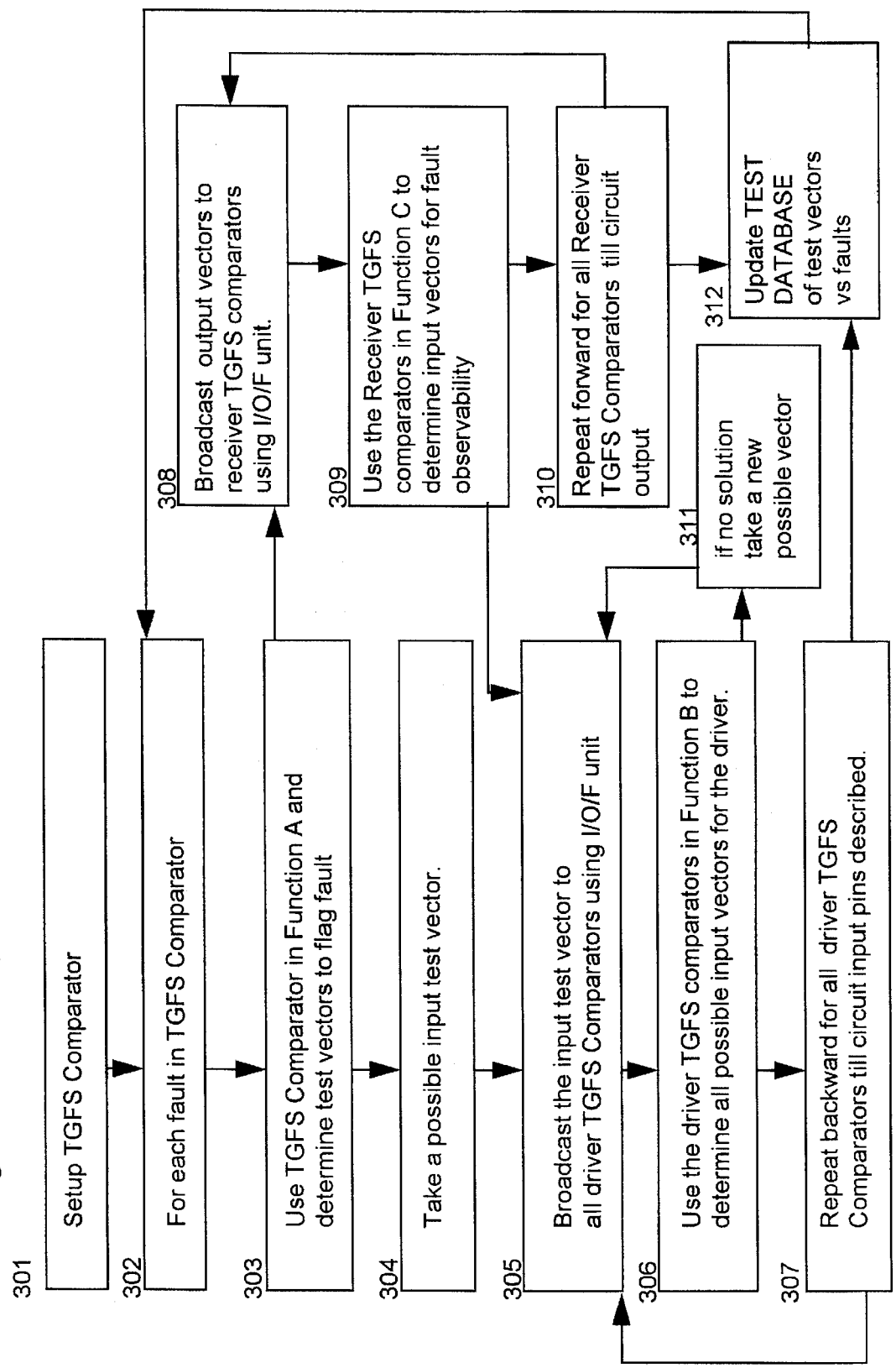
Fig 3 - Flow to generate test vectors using TGFS Comparators

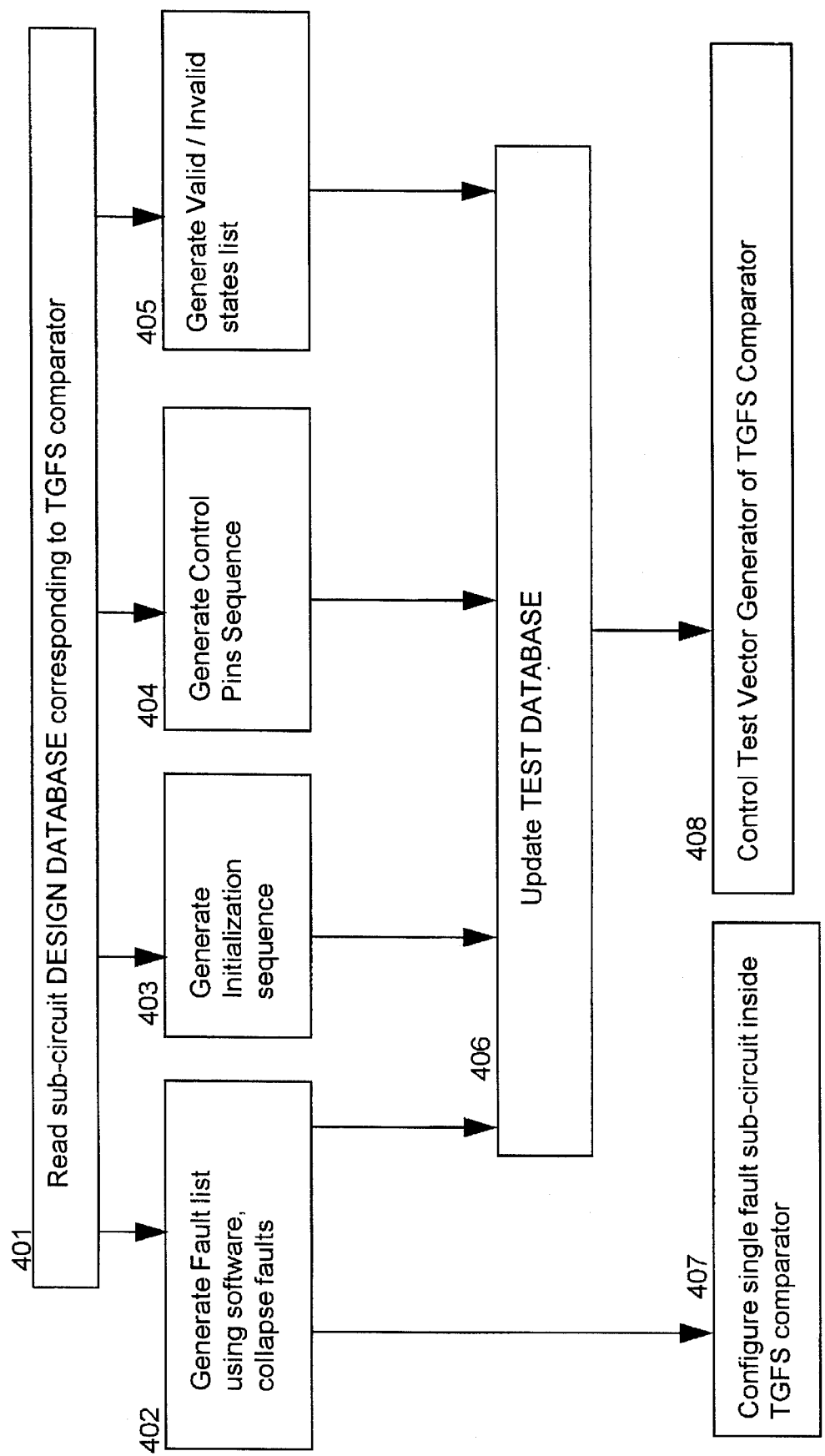

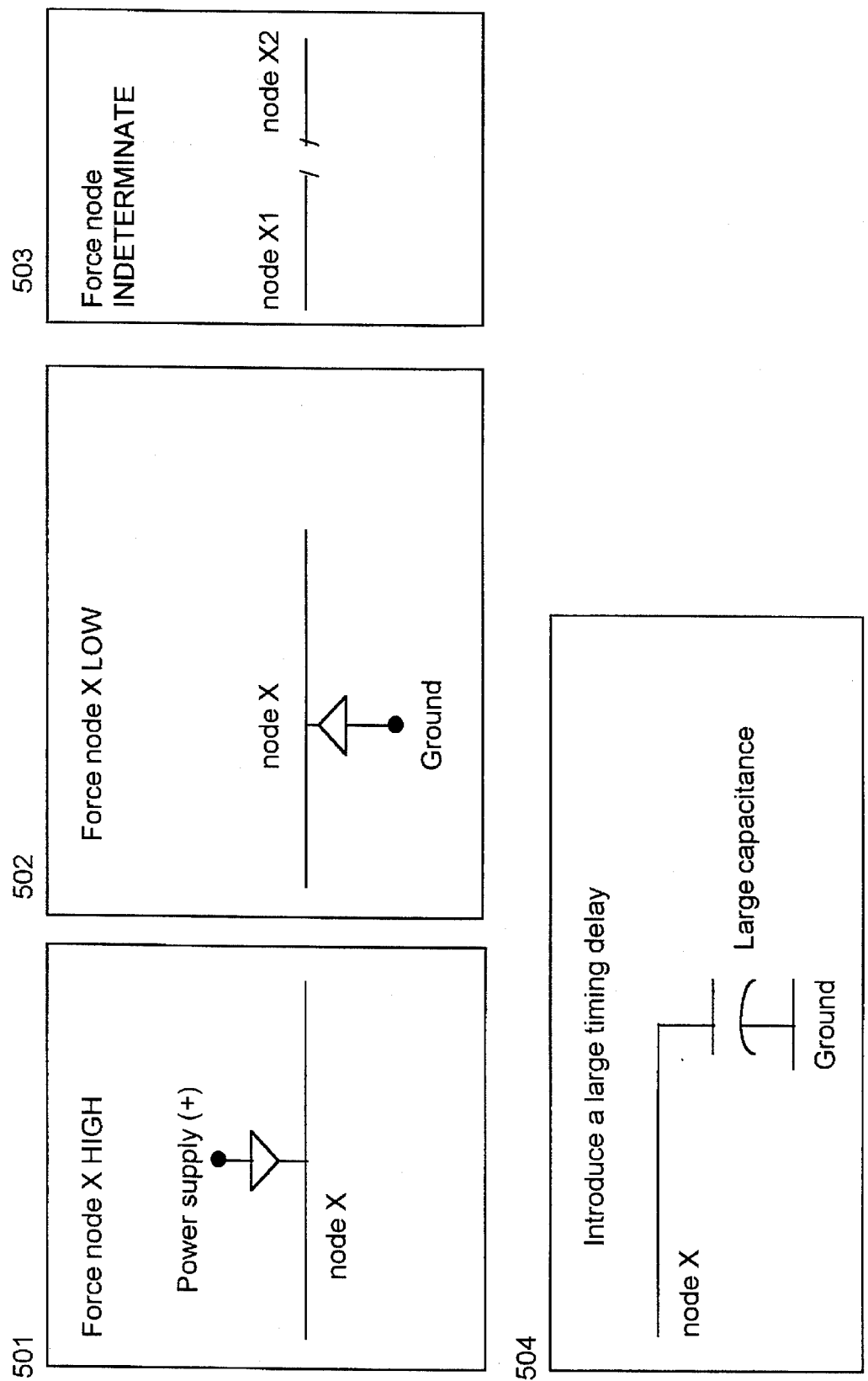

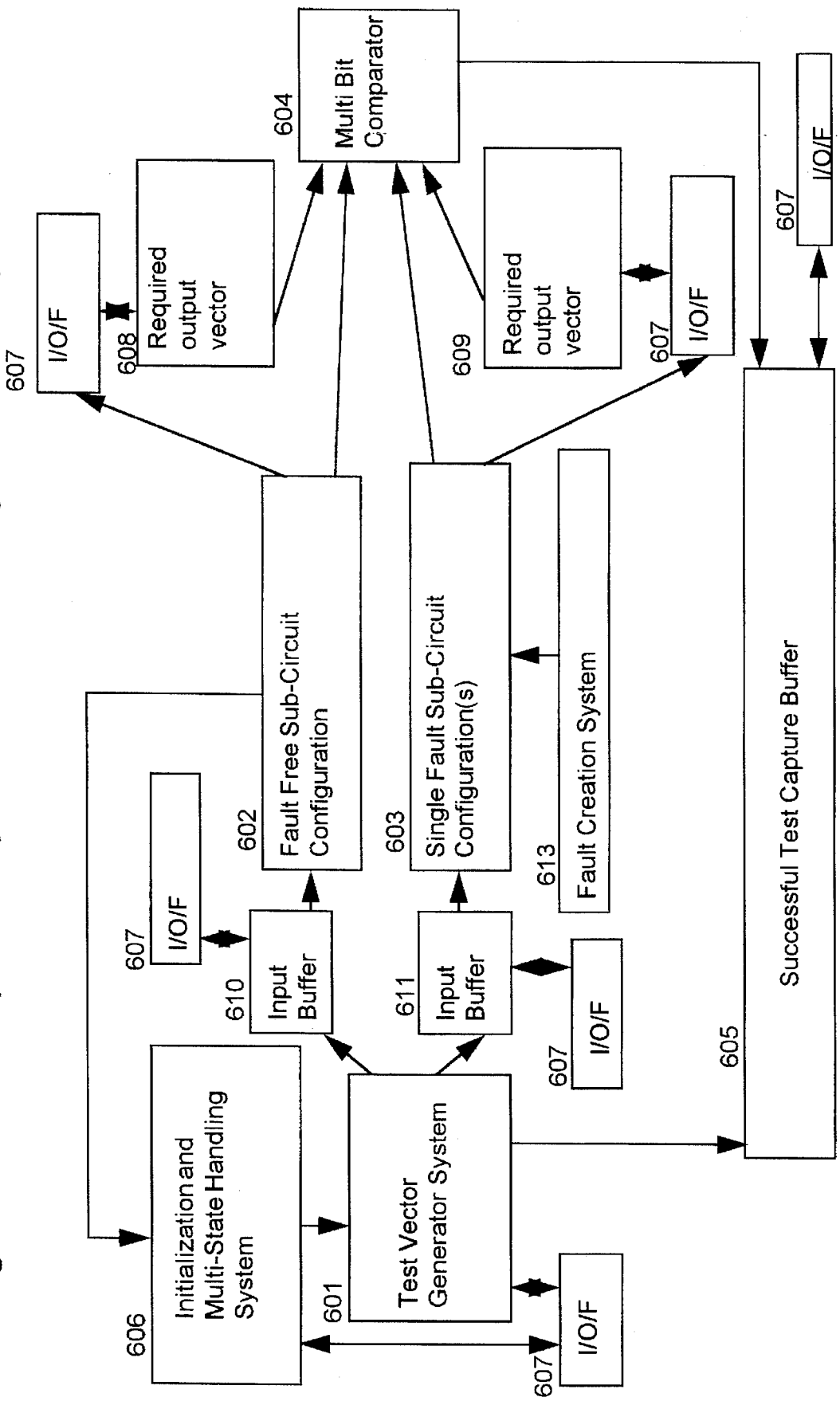
Fig 6 - TGFS Comparator System based on programmable logic circuits

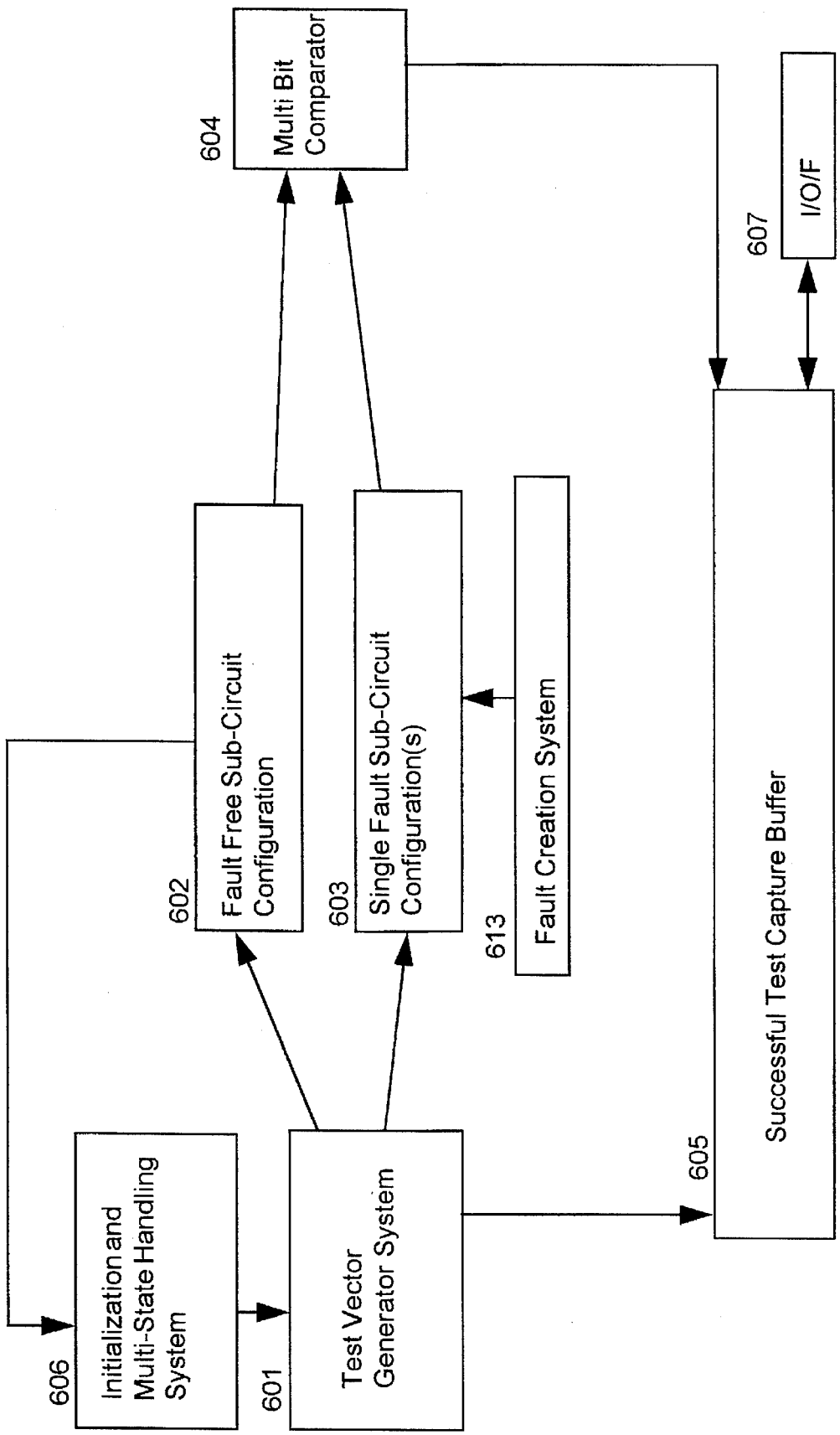
Fig 6a - TGFS Comparator System under Function A

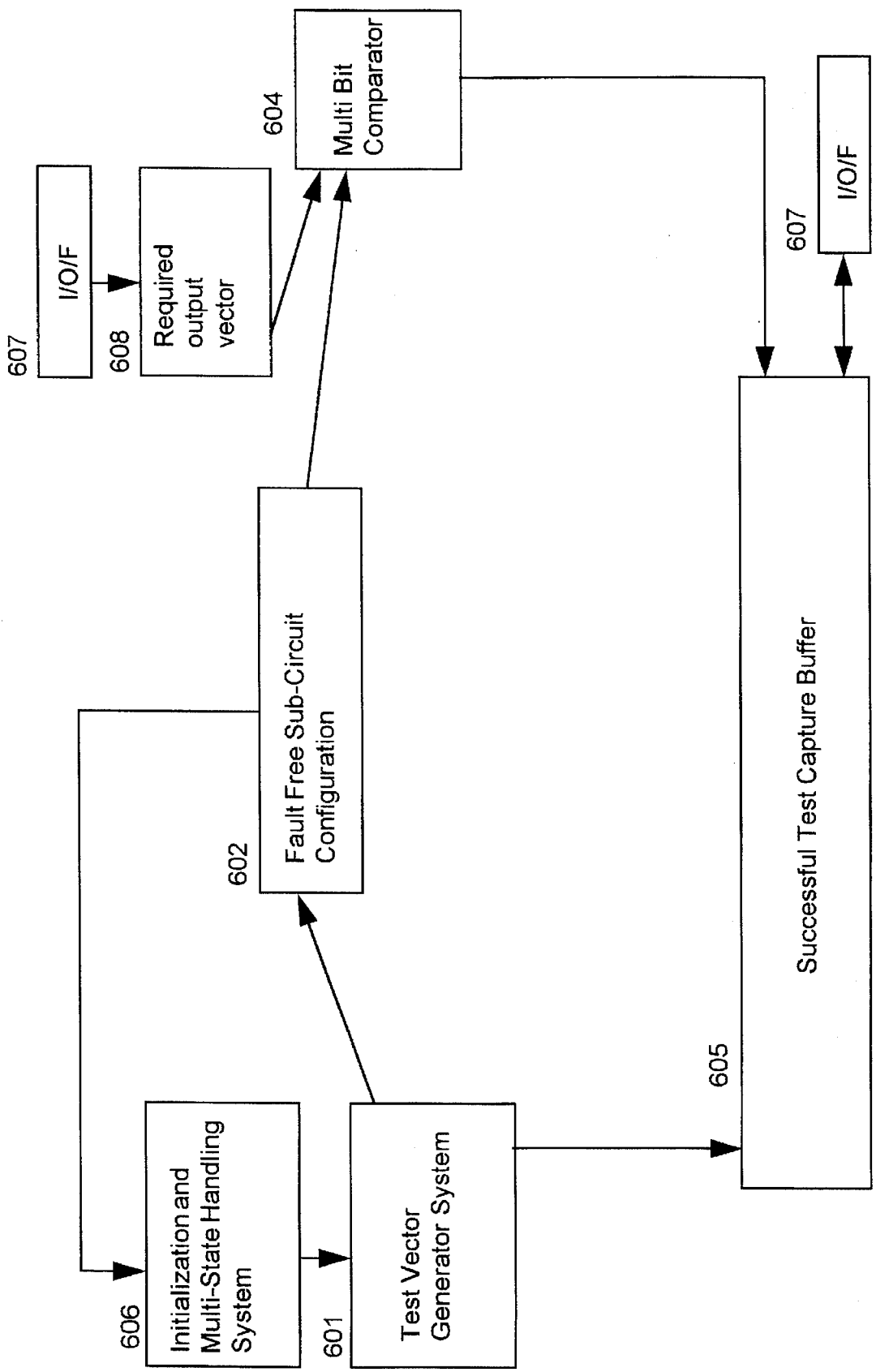
Fig 6b - TGFS Comparator System under Function B

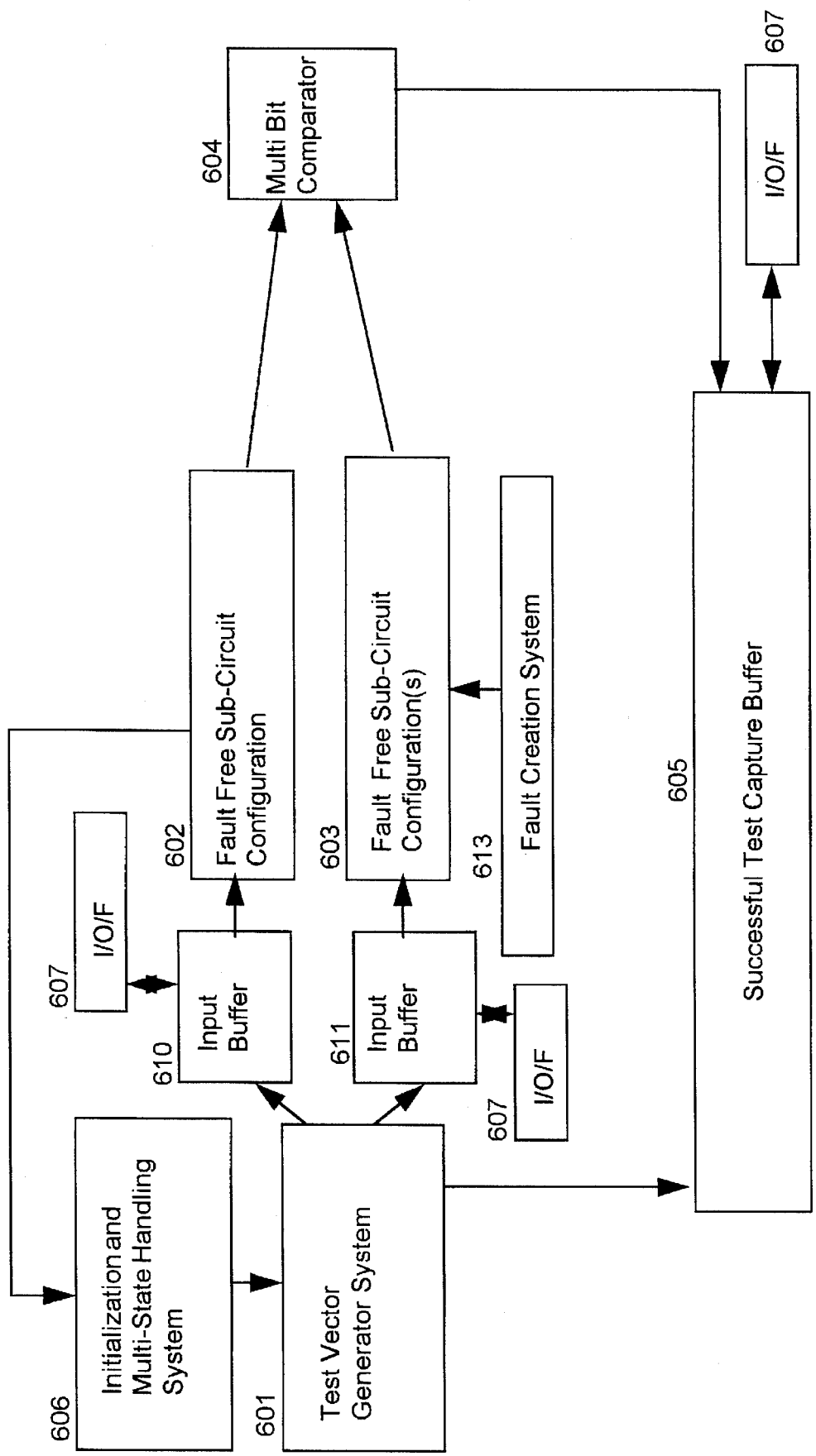
Fig 6c - TGFS Comparator System under Function C

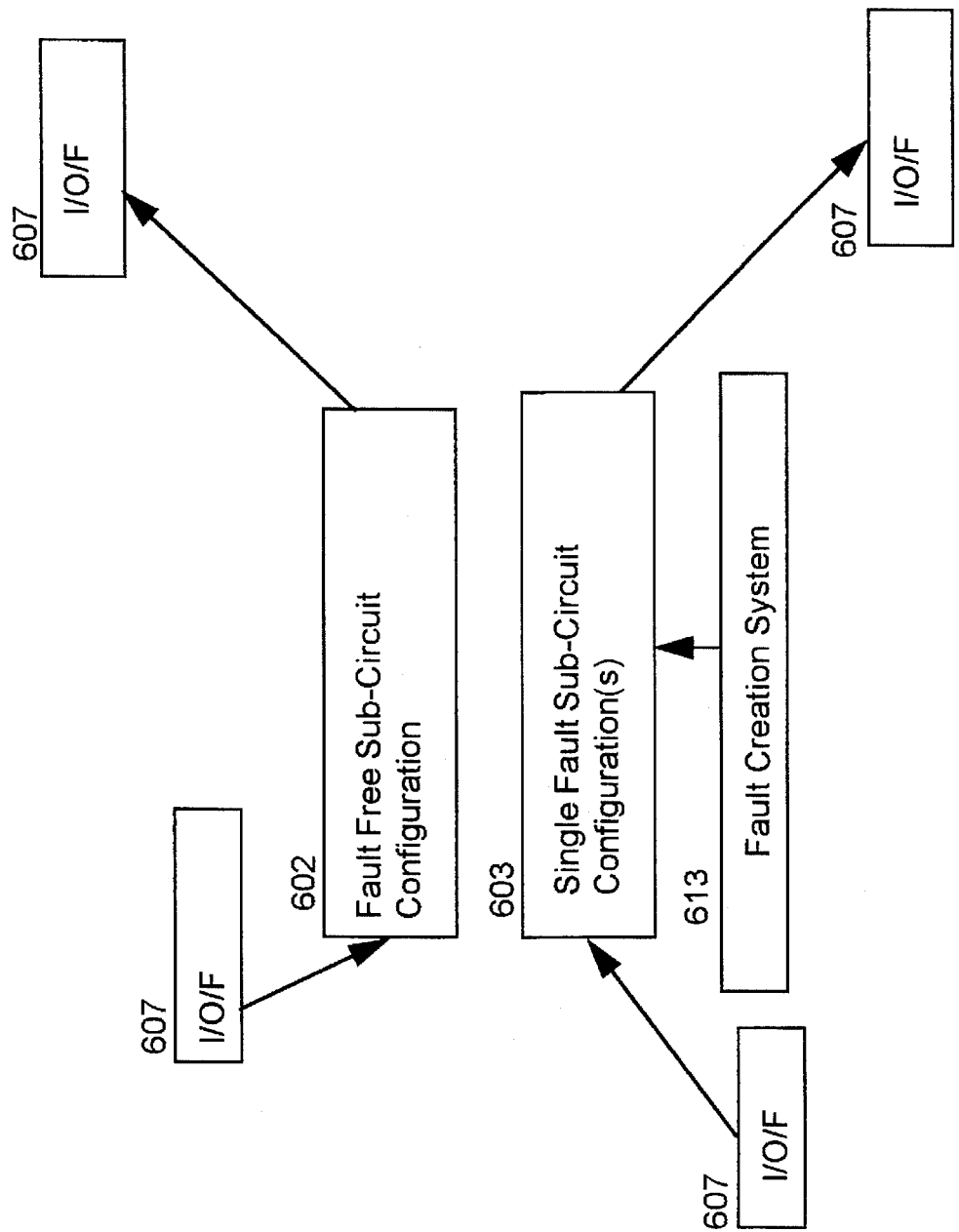
Fig 6d - TGFS Comparator System under Function D

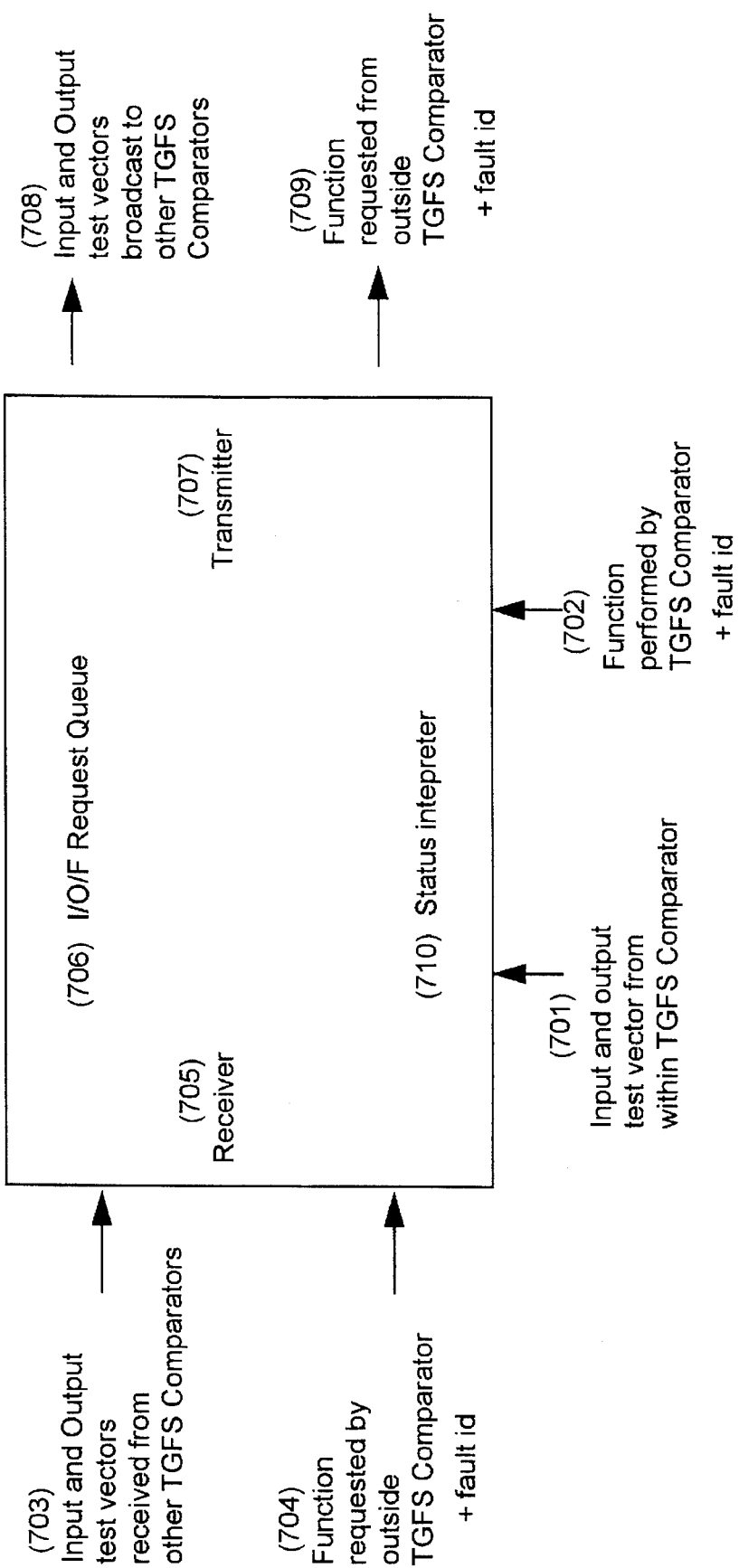
Fig 7 - I/O/F Unit

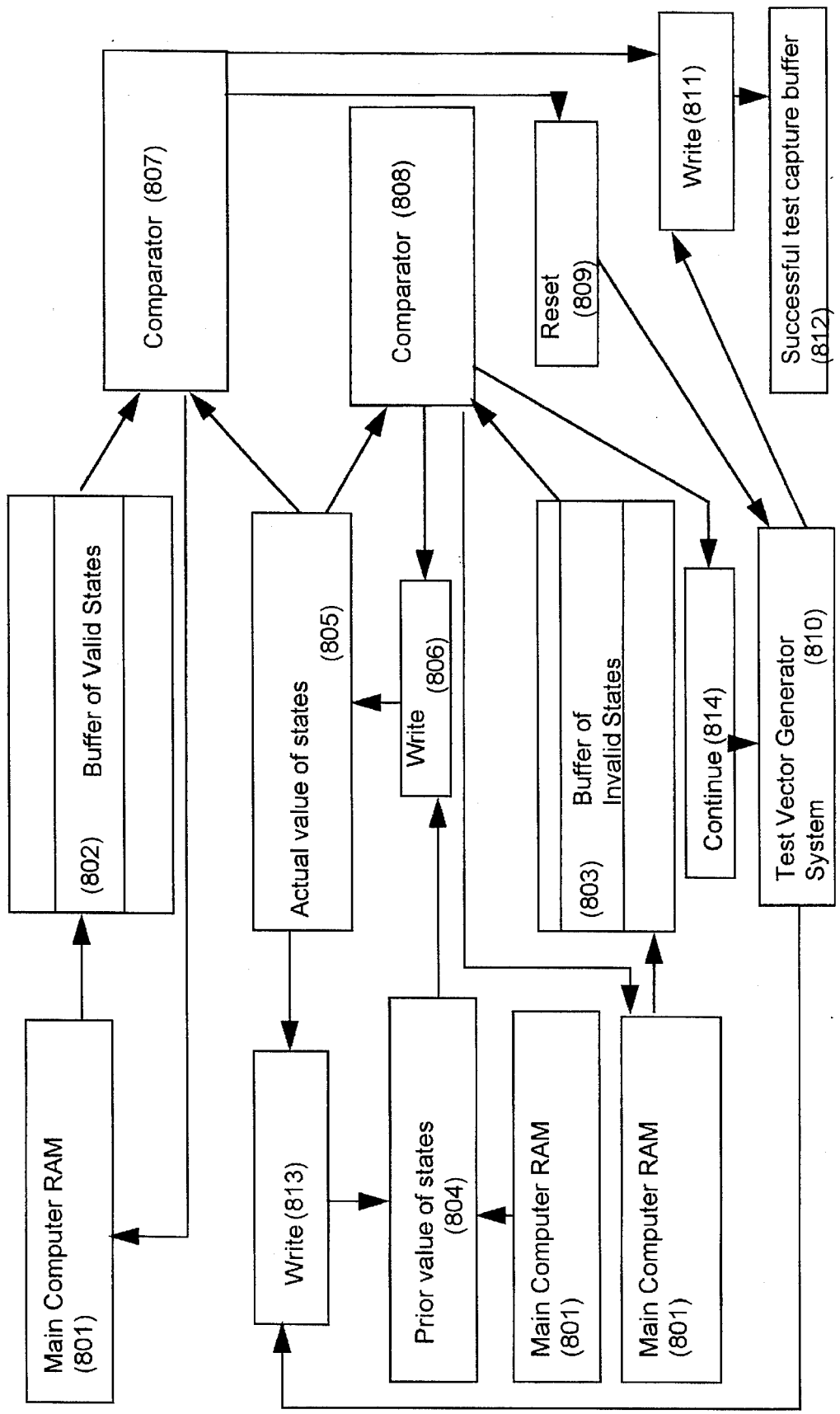
Fig 8 - Initialization and Multi-State Handling System

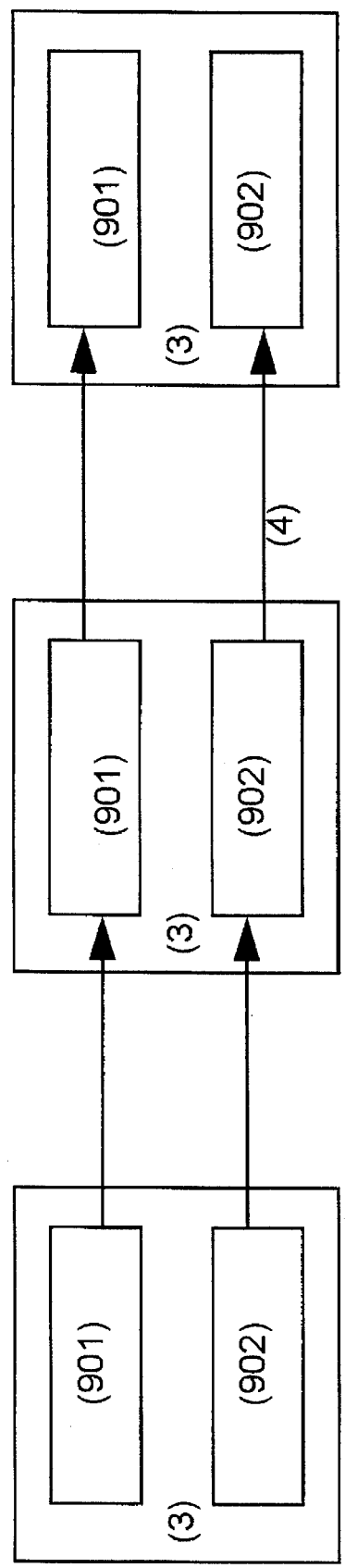
Fig 9 - Interconnected TGFS Comparator Sub-Circuits

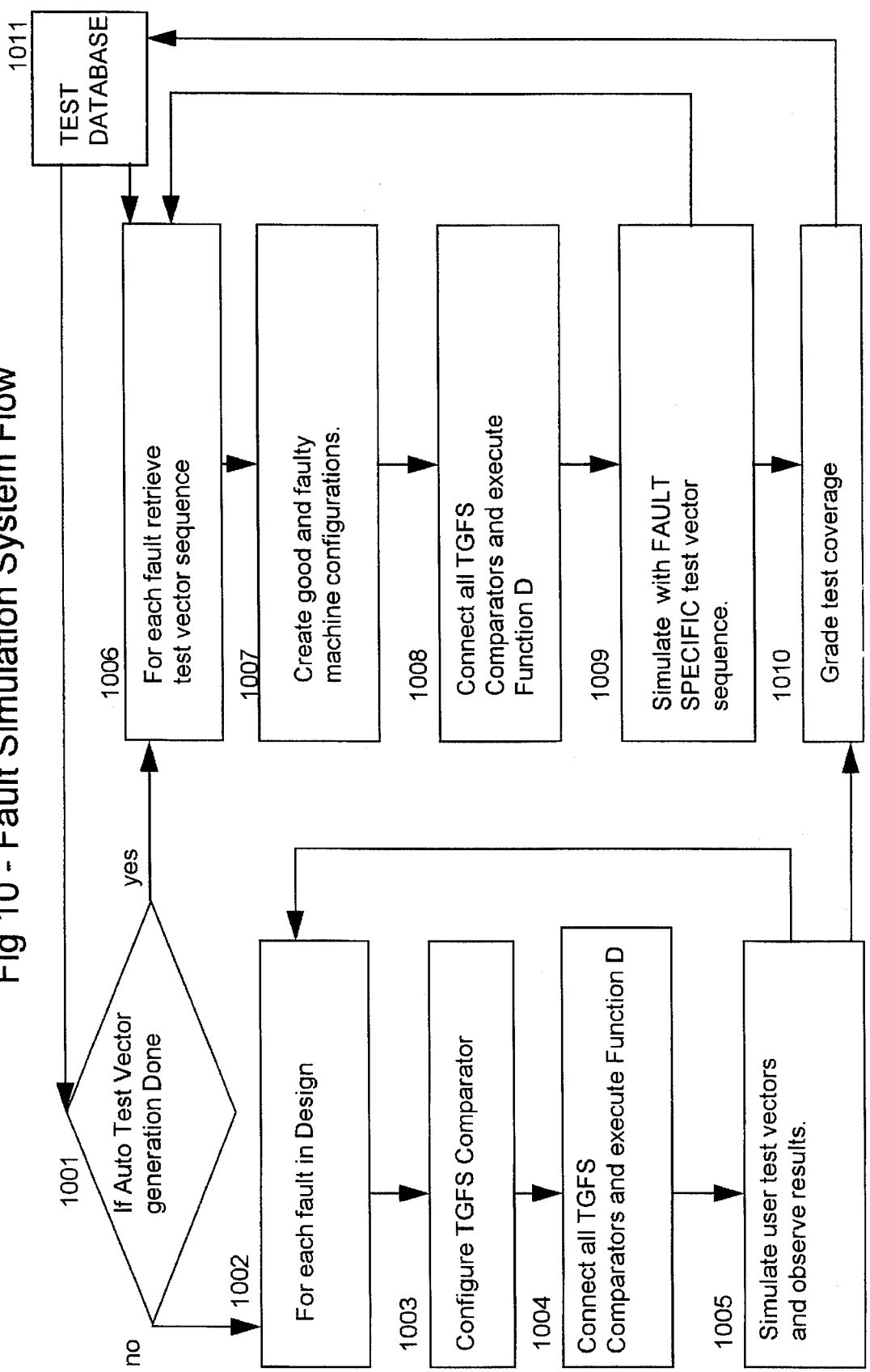
Fig 10 - Fault Simulation System Flow

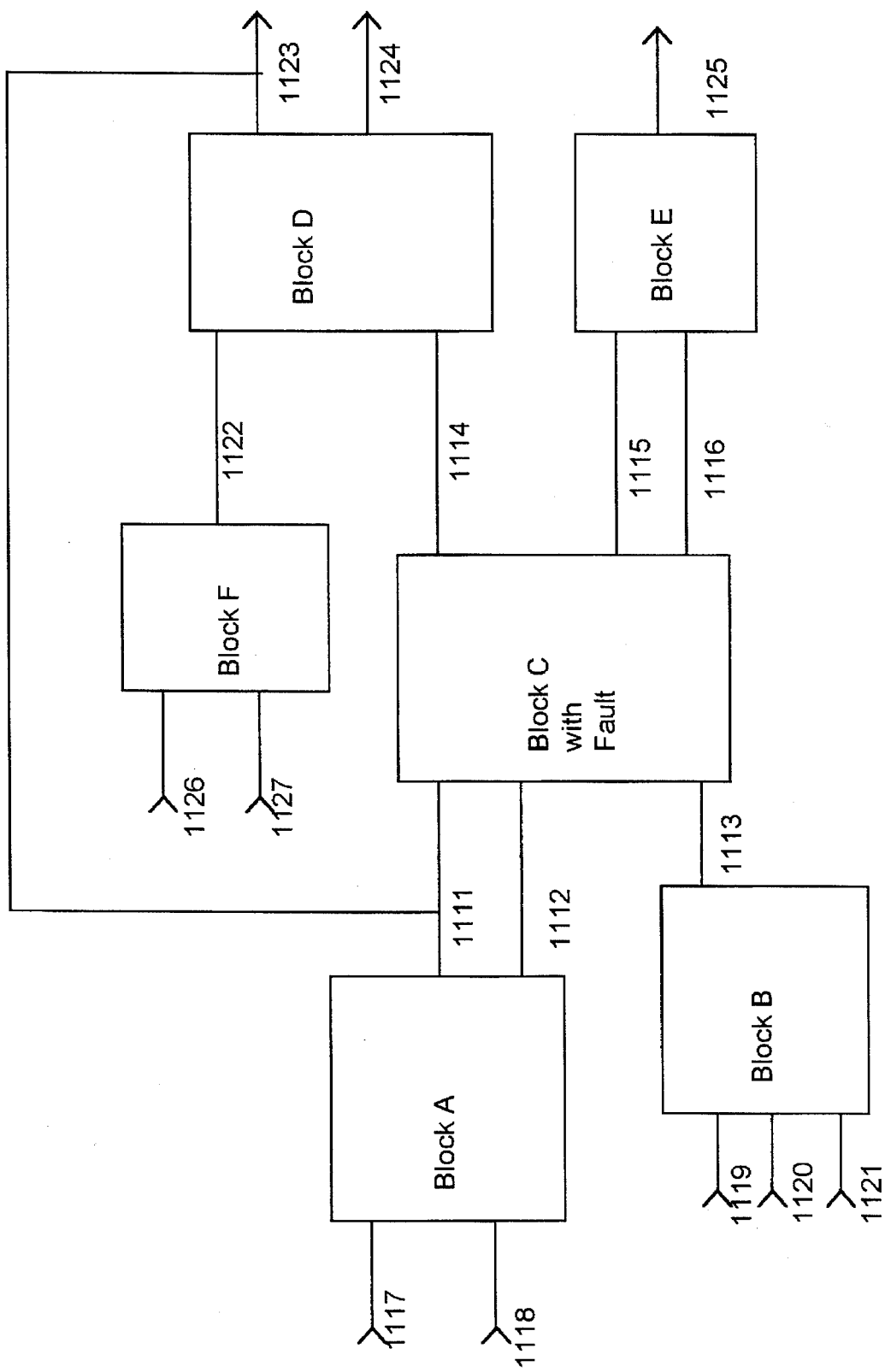
Fig 11 - Example for Test Generation and Fault Simulation

APPARATUS AND METHOD FOR AUTOMATIC TEST GENERATION AND FAULT SIMULATION OF ELECTRONIC CIRCUITS, BASED ON PROGRAMMABLE LOGIC CIRCUITS

BACKGROUND

Current software automatic test generation tools use software algorithms to compute test vectors. This class of test generation tools does not guarantee 100% coverage of possible faults in an electrical circuit. Software test generation tools do not use hardware emulation methods to generate test vectors. Software algorithms for test vector generation and fault simulation are inherently sequential and require considerable effort to do operations in parallel. There is a need for an automatic test generation tool that provides 100% coverage of possible faults in an electrical circuit.

Hardware accelerators for fault simulation use internal hardware gate representations to speed up logic computations. This approach is fast but relies on brute force alone. Hardware accelerators do not use a fault specific approach for testing faults. Present hardware fault simulation tools take a great deal of time to test every fault on a gate design. Emulation-based tools for prototyping and system level testing use re-programmable circuits and devices to represent a design and offers a scheme for system level testing, by emulating the design into the actual board or system wherein the design is to be used. This approach does not address the problem of 100% coverage of faults or does not generate test vectors for later use in an actual tester for testing at time of manufacture and does not perform any fault simulation. Emulation tools are used today to test prototypes. Emulation allows an IC designer to build a programmable representation of a circuit and check logic functionality. There are no applications using emulation or programmable logic methods to simulate faults nor automatic test generation. There is no close relationship in the prior art between test generation tools and fault simulation tools.

No patents have been found that directly claim the current invention. Three related patents are:
- U.S. Pat. No. 3,492,572—Programmable Electronic Circuit Testing Apparatus Having Plural Multi-Function Test Condition Generating Circuits.
- U.S. Pat. No. 5,058,112—Programmable Fault Insertion Circuit.
- U.S. Pat. No. 5,257,268—Cost Function Directed Search Method for Generating Tests for Sequential Logic Circuits.

For the foregoing reasons, there is a need for a high performance automatic test generation and fault simulation device for electronic circuits.

SUMMARY

In view of the drawbacks in the prior art, an object of the present invention is to provide a computer based programmable test generation and fault simulation apparatus and method for electronic circuits. The test generation apparatus and method can automatically determine and generate the right set and sequence of input voltage vectors to locate unique faults inside an electronic circuit. This includes fault specific test sequences.

A second object of the invention is to permit communication between sub-circuits via a hardware based messaging system that transmits and receives test vector information, and function to be performed thus acting as a process sequencer.

A third object of the invention provides an automatic test generation and fault simulation device that uses programmable logic devices to generate and evaluate test vectors providing 100% test coverage of all the faults in a circuit.

A fourth object of the invention is to provide a fault simulation environment for simulating faults and grading the fault coverage of test vectors.

In accordance with one aspect of the present invention, a programmable automatic test pattern generation and fault simulation (TGFS) apparatus comprising, a plurality of I/O/F messaging buses, a plurality of data storage devices, a plurality of data buffers, a plurality of programmable logic devices, a plurality of test vector generators, and a plurality of multi-bit comparators, said I/O/F messaging buses serving as a memory means and time delay processor for, and located substantially between, said plurality of data storage devices, said plurality of data buffers, said plurality of programmable logic devices and said test vector generators.

In accordance with another aspect of the claimed invention, the apparatus' permanent data storage device further comprises a design data base of a circuit, and a test data base of said circuit, the design data base comprises information on the circuit design connectivity, initialization, control, behavior, and timing. The test data base comprises information on the test circuit related to a master list of faults, and recording of results of test generation stored specific to each fault.

In accordance with another aspect of the claimed invention, the data buffers further comprise a plurality of look-up tables.

In accordance with another aspect of the claimed invention, the test vector generators further comprise any random or non-random counter type.

In accordance with another aspect of the claimed invention, the programmable logic devices may be field programmable gate arrays. Furthermore the programmable logic devices are programmed with identical partitions of a plurality of sub-circuits of a circuit, the programmable logic devices being divided into a first group and a second group, where the first group are fault free sub-circuits and the second group are single fault sub-circuits, where at least one fault free sub-circuit is connected in parallel to a plurality of single fault sub-circuits, each fault read from a test database.

In accordance with still another aspect of the claimed invention, the I/O/F messaging buses comprises a plurality of receiver circuits, a plurality of transmitter circuits, a plurality of data queues, a plurality of function queues, a plurality of status interpreters, where data and function instructions enter through said plurality of receiver circuits first, then to any combination of said plurality of data queues, said plurality of function queues or said plurality of status interpreters second, and said plurality of transmitter circuits third.

In accordance with another aspect of the claimed invention, the I/O/F messaging buses further comprises, a means for directing test data and function instructions to and from said plurality of programmable logic devices, said test vector generators and said data storage devices, a means for receiving test data and instructions on function to execute with said test data, said transmitter circuits being capable of transmitting test results and instructions on function to execute on said test results, a means to delay processing of test data from said single fault sub-circuits and said fault free sub-circuits, where said function queues receive and buffer instructions on what function to perform with corresponding said test data, said status interpreter starts and stops execution on said test data, a means for switching of function between said plurality of multi-bit comparators permitting each said multi-bit comparator to pass data and trigger other said PLDs to execute a new function, a means to record values of said input and output test vectors along with the type of function being executed and a fault identifier, a means to transmit said input and output vectors, functionality requests and fault identifiers to said plurality of multi-bit comparators, said multi-bit comparators performing analysis of each said functionality request, a means to receive messages from other said sub-circuits providing said input and said output test vectors, said functionality request and said fault identifier, said plurality of data queues and said plurality of function queues, queue data and function instructions for execution by said multi-bit comparators, status interpreter system tracks status of execution.

In accordance with yet another aspect of the claimed invention comprises a means for tracking valid and invalid states supplied from the design data base, comparing the valid and invalid states with actual logic states within the test circuit, reversing the test vector generators to restore original valid states when states are found invalid, skipping invalid test vector, and proceeding to next test vector.

In accordance with yet another aspect of the claimed invention, the apparatus further comprises a means for implementing a fault producing scheme used to configure a plurality of single fault sub-circuits connected in parallel to a plurality of fault free sub-circuits, and a means to successfully determine input test sequences for discovering a fault inside a single fault sub-circuit for the circuit, by applying all possible input pin combinations for the circuit and identifying those input pin combinations that show a difference between the fault free sub-circuit and the single fault sub circuit and to save the input test sequences and corresponding output test vector sequences of each fault free sub-circuit and of the single fault sub-circuit to the test database.

In accordance with another aspect of the claimed invention, the apparatus further comprises a means to act as a fault simulation system by introducing a fault, then connecting all multi-bit comparators together that make up the circuit, such that all fault free sub-circuits are connected together as per circuit design and one copy of the single fault sub-circuit are connected together, without any parallel connections between the inputs and outputs of each fault free sub-circuit and the single fault sub-circuit and applying input test vectors to the circuit and observing the outputs of the fault free sub-circuits and the single fault sub-circuits. Then comparing the outputs for differences, and updating the test data base.

In accordance with another aspect of the claimed invention, a method of automatic test pattern generation for an electronic circuit using comprising the steps of: dividing a netlist of a test circuit into partitions, programming said partitions onto a plurality of TGFS apparatus, generating test vectors for said partition using said TGFS apparatus to flag faults within each said partition, propagating said test vectors to boundaries of said circuit through a plurality of I/O/F messaging buses, converting said test vectors to primary circuit input test vectors by processing said test vectors via a plurality of said TGFS apparatus.

In accordance with another aspect of the claimed invention, a method of fault simulation for an electronic circuit in a computer comprising: creating artificial faults, placing said faults in a plurality of programmable logic devices, using a counter to input test vectors into said plurality of programmable logic devices, and capturing said input vectors and output vectors in a test vector buffer or a test database, comparing said output signals to generate said test pattern, and analyzing said test pattern for fault simulation.

In accordance with another aspect of the claimed invention, the method comprises the generation of artificial faults by simulating artificial faults and recording the artificial faults in a test data base. The method also comprises the programming of artificial faults into a plurality of programmable logic devices. These programmable logic devices are divided into a first group and a second group. The artificial faults are programmed into the second group of programmable logic devices. The method further comprises inputting test vectors into the first group of programmable logic devices and the second group of programmable logic devices and obtaining output signals from the first and second group of programmable logic devices, and compiling a test data base of the output signals.

In accordance with yet another aspect of the claimed invention, a method of statistical analysis of the test pattern for fault simulation.

Thus an advantage to the current invention over the prior art is the high performance attained by use of PLDs. The invention also permits a method to identify faults feeding input vectors to a circuit and the differences between fault-free circuits and faulty circuits. The method and apparatus work equally well on combinational, sequential and asynchronous type logic devices. The method preprograms multiple parallel faults, thus the time to reconfigure each new fault is eliminated. The invention guarantees test vectors that will lead a circuit through valid states and prevent transition through invalid states. Parallel processing of test vector generation and fault simulation is inherent in hardware construction.

Another advantage is test vectors can be graded for their fault coverage.

Another advantage is there is no requirement for the use of any scan-design techniques or design-for-testability techniques. Thus the system permits greater freedom in circuit design techniques and permits higher density designs.

Another advantage is the invention provides fault specific test sequences.

BRIEF DESCRIPTION OF THE DRAWINGS

FIG. 1—Apparatus for Test generation and Fault Simulation of Electronic Circuit Designs.

FIG. 2—Test Generation and Fault Simulation System Flow.

FIG. 3—Flow to generate Test vectors using TGFS Comparators.

FIG. 4—Flow description setup of TGFS Comparator.

FIG. 5—Fault types.

FIG. 6—TGFS Comparator system based on programmable logic circuits

FIG. 6a—TGFS Comparator system under function A.

FIG. 6b—TGFS Comparator system under function B.

FIG. 6c—TGFS Comparator system under function C.

FIG. 6d—TGFS Comparator system under function D.

FIG. 7—I/O/F Unit.

FIG. 8—Initialization and Multi-state handling system.

FIG. 9—Interconnected TGFS Comparator Sub-circuits.

FIG. 10—Fault Simulation System Flow.

FIG. 11—Example for test Generation and Fault Simulation.

DESCRIPTION OF THE PREFERRED EMBODIMENT

The following definitions are important in understanding the present invention.

"TGFS" is Test Generation and Fault Simulation.

Functions A–D are detailed in FIG. 6A through 6D and the corresponding descriptions.

"Function A" is the generation of test vectors to flag a fault inside a sub-circuit.

"Function B" determines the input vector sequence given a required output vector.

"Function C" determines the values for some input pins, so the remaining inputs may propagate to the output.

"Function D" is the set up for fault simulation.

Referring now to the drawings. FIG. 1 is an overview of an Apparatus for Test generation and Fault Simulation of Electronic Circuit Designs. The design consists of a central processing unit 101 or CPU of one or more computers capable of launching and managing simultaneous multiple processes. Random access memory (RAM) 103 is required, compatible with the CPU 101. The design reconfigurable system 105 consists of TGFS comparators. The programmable device pins are mapped on to RAM 103, to allow for voltage initialization. A programmable system board may be purchased from a manufacturer such as ALTERA, XILINX, APTIX or other vendors. The necessary databases are stored on a permanent storage device 102 and controlled by the CPU 101. Information is transferred between the various components through the computer's bus 104. The bus 104 is not unique to the inventive concept.

The permanent storage devise 102 includes two databases. A design database 102A and a test database 102B.

The design database 102A that stores details about the design. It contains a high level description of the design using behavioral modeling language such as VHDL or VERILOG. The design database 102A may include state information and information on the sequence of valid and invalid states for memory elements inside the design. It may include information on clock timing sequences or other control signals. Providing control signal information improves the performance of test generation.

The design database 102A must also have information on mapping of high level state information to actual bits. This is available from the Logic Synthesis system, that takes in the high level behavior information (VHDL, VERILOG etc) and implements them in gates, flip-flops, registers and other elements transitioning through binary states.

The design database 102A must also have a schematic netlists in an industry standard format recognizable by the programmable logic devices used. The netlist provides information on the connectivity and type of logic elements. It is necessary to a standard vendor library (i.e. Xilinx, Altera or Lattice) where the functionality and timing behavior of each element is understood.

The design database 102A must further include timing behavior of the circuit to be tested. This will improve mapping the design on to a PLD and prevent missing some functionality.

The design database 102A is stored in permanent storage 102 and sections are loaded into RAM 103 as the invention requires.

The test database 102B also resides in permanent storage 102 and stores data on faults and tests. This information includes a list of all possible faults and all values applied to the primary inputs of the circuit used to flag each fault. This information will be generated by the automatic test generation system and stored in the test database 102B.

The test database 102B will store corresponding output sets of good and fault indicating vectors, which are a result of applying each test vector to detect each fault. The test database 102B will be loaded on the permanent storage 102 and sections of it are loaded into RAM 103 to improve performance.

FIG. 2 shows a test generation and fault simulation flow chart. A circuit design is entered 201 and partitioned into Sub-circuits 202. The sub-circuit blocks are mapped to TGFS comparators 203. The TGFS comparators 203 generate the test vectors for all faults in all sub-circuit blocks 204. After the test vectors and faults are generated, fault simulation 206 is used to determine the accuracy and completeness of the test vectors generated.

FIG. 2 represents a flow chart of the test generation and fault simulation method. First the circuit design is entered into the system 201. This can be any standard vendor based solution such as schematic entry or high level behavioral language (VHDL or VERILOG) entry accompanied by design synthesis. A number of vendors provide tools in this area such as SYNOPSIS, MENTOR, CADENCE, VERILOG etc.

A circuit design mapping system 202 subdivides the netlist into smaller sub-circuits that can fit on to less than half of a single PLD. This gives room for two or more copies of the same sub-circuit to be mapped on to a single device, to implement a good and a faulty sub-circuit. This also reduces the input/output pin count of each sub-circuit block to a smaller manageable number. Sub-circuit division would not be necessary for a small design if it fits completely in half of a single programmable logic device, and has 20 or less input pins. Sub-circuit blocks are then mapped to TGFS comparators 203.

The combined process of using TGFS comparators 203 to generate test vectors 204 forms the next step in the process (see FIGS. 3 and 4). Typical faults modeled are 'stuck-at-1' and 'stuck-at-0' type faults. The system may also be used to model other faults such as due to open-connections or due to large nodal capacitances that may slow down a node. Test vectors are generated for the inputs of a sub-circuit and then traced back to values required at the input pins. A cross-reference database between faults and test vector sequences is maintained for later recall during fault simulation.

Users may have specific user generated test vectors 205 to be graded for their test coverage. As far as possible a brute force simulation of vectors should be avoided. Users are encouraged to use the test vector generation capability, which generates test sequences, specific to a fault.

Validation of fault coverage 206 of test vectors requires using a fault simulation system. The objective is to implement a high speed hardware based approach for computing the test coverage of a given set of test vectors including the specific test vectors generated by the test vector generation system 204.

FIG. 3 provides greater detail of how TGFS comparators 204 are used for generating Test Vectors for all faults in all sub-circuit blocks. The first step involves the setup of the TGFS comparator 301 (see FIG. 4). Second, the device loops through all possible faults 302 and use the TGFS comparator 301 in Function A to determine test vectors to flag the fault 303. One input test vector 304 is taken and the input test vector is now back propagated to the primary inputs by broadcasting the input test vector to all driver TGFS comparators using an I/O/F unit 305 and a driver function B 306. The back propagation is repeated until the primary circuit pins of the circuit boundary are described. In no solution exists then there is an option of repeating the backward propagation with a new alternative test vector 311.

To allow the test to be observable the results of the tests are propagated to the circuit output pins using a second I/O/F unit 308 and the receiver TGFS comparators 309 which are used to implement Function C. Function C 309 may call Function B 306 since otherwise the output test vector may not propagate to the output and be distinctly observable. The vectors traverse through a multiplicity of comparators until the circuit output pins are reached 310. Finally the test database 102B is updated with the right input and output test vector vs fault information 312.

Referring to FIG. 4—Flow Describing Setup of the TGFS comparator 203. The flow chart provides a diagram of the method involved in setting up the TGFS comparator 203. The first step 401 involves reading Sub-circuits of the netlist from the design database 102B and mapping them into the FPGA devices inside the TGFS comparator 203. Fault collapsing 402 is used to generate a fault list 402A which is used either to configure 407 a single fault sub-circuit 603 inside a TGFS comparator 203. The test database 102B is updated with complete fault information.

Fault creation occurs inside the programmable logic device by altering a copy of the gate level netlist of a sub-circuit of the full circuit. Vendor tools perform the mapping of the netlist to actual layout on the PLD. An alternative method eliminating the mapping time is to have pre-mapped fault circuitry, controlled by enabling logic, which may turn the fault on or off. This approach will lead to more complex and larger sub-circuits and also additional control pins. Another option is to have many parallel copies of the sub-circuit, with one fault free copy and the remaining to have a single different fault each. At any moment only 2 copies, a good and a fault copy are being analyzed. As soon as one fault is analyzed, a switch (or connection) to the next single-fault copy is made. The connection may be done using external switching circuitry such as a pass transistor or multiplexor. This obviously increases the programmable logic devices required for the design.

Generation of an initialization sequence 403 for the sub-circuit inside the TGFS comparator 203 is used to update the test database 406. The control pin sequence 404 is programmed and also used to update the test database 406. Example signals such as clocks ad resets have a known sequence and there is no need for generating these values. Finally a list of valid and invalid states 405 is entered into the test database 406 (102B). These valid and invalid states may be derived from a high level description of the sub-circuit behavior. The single fault sub-circuit 603 is also configured, this is a mirror image of the fault-free sub-circuit 602 except for one fault (see FIG. 5). The test database 102B is updated 406 and this in turn will control the test vector generation sequence 408.

FIG. 5—Fault Types. This drawing represents some samples of the fault types that will be modeled by the faulty configurations. Some nodes may be forced to a high value 501 or low value 502. Other sample errors include indeterminate values caused by signal disconnections 503 or introduction of large timing delays 504.

Refer FIG. 6—TGFS Comparator System based on Programmable Logic Circuits.

This unit is the heart of the invention. The apparatus consists of a fault free sub-circuit 602 to be tested and a mirror copy of the sub-circuit containing a single fault 603. The TGFS comparator 203 has three main functions.

Referring to FIG. 6A which details Function A. This function determines the fight sequence of test vectors for the inputs of the sub-circuit modeled by the comparator. Thus for a combinational circuit it may be a single vector. In a sequential circuit it would be a sequence of test vectors that allow the sequential circuit to trace through a sequence of valid states. The purpose of Function A is to generate test vectors to flag a fault inside a sub-circuit.

The test vector generator 601 is first programmed with the control pins sequence 404, from information from the design database 102A (additional details of the programming of the test vector generator 601 follow the description of the drawings). In the case of sequential logic we need information on allowable valid and invalid states, this is maintained in buffers as show in FIG. 8.

The TGFS comparator 203 identifies one or more test vectors that will flag the fault, i.e. Show a difference between the fault free sub-circuit 602 and the single fault sub-circuit 603. The control pin sequence 404 information is used wherever available, since this reduces the total number of combinations. This information is normally available from the design database 102A (401). The control pin information is also necessary in cases where a sub-circuit block may act either as a driver or a receiver, such as bidirectional functionality. Example: A 'read' function or as a 'write' function for a memory circuit. The rest of the input pins are then counted up through the entire solution space, example if there are 5 pins, we would count from 00000 to 11111.

If a difference is revealed between the fault free sub-circuit 602 and the single fault sub-circuit 603, the process is done, and the saved sequence of test vectors along with the last test vector provides the fight sequence of test vectors.

The operation of test vector generation for synchronous logic proceeds as follows: The actual value of logic states 805 is compared with the list of valid states stored in the buffer 802. If there is a match as shown by the comparator then the test vector is saved into the successful test capture buffer 605 and the test vector generator 601 is reset to start the count from the beginning.

If the actual value of logic states 805 is equal to one of the invalid states 802 the process reverses the actual state to what it was prior to application of the last vector. Then the input test vector generator 601 resumes its count up. The 'valid states' and 'invalid states' information is provided by the design database 102A.

To illustrate; for a ring counter counting up 0001 to 0010 to 0100 to 1000 and back to 0001, the valid state allowable to go from 0010 is 0100. The invalid state is 0010 to 0001, since we are not allowed to count backward.

Repetition of the process starting from where the TGFS comparator 203 is to identify one or more test vectors that will flag a fault through reversing the actual state prior to the last vector is done until a test sequence that flags the fault (by showing a difference between the fault free sub-circuit 602 and the single fault sub-circuit 603) is found. If at the end of the entire count up we fail to find a test sequence that flags the fault, then the fault is declared as non-detectable, and marked as such in the test database 102B. The reason for this may be (a) a logic circuit with a fixed logic value for its outputs, (b) a logic design error or (c) because insufficient information on valid and invalid states was provided to the tool.

When trying to determine the right sequence of input test vectors to flag a fault, success is met when the fault free design configuration 602 and the single fault design configuration 603 must produce a difference, for the same set of inputs.

Referring now to FIG. 6B which details Function B. This function determines the input vector sequence given a required output vector. Function B is designed to trace back the inputs generated in Function A to the input pins of the circuit. This is achieved by traversing through a series of driver sub-circuits. Each driver sub-circuit is modeled by a TGFS comparator circuit under Function B and the inputs of the driver determined by counting up through all possible inputs to produce the necessary output pattern.

Only the fault free sub-circuit 602 is used. The required test vector is loaded onto the required output buffer 608, using the I/O/F unit 607 to manage the data and function messaging process.

Repetition of the process starting from where the TGFS comparator 203 is to identify one or more test vectors that will flag a fault through reversing the actual state prior to the last vector as in Function A, with the objective being to find a test sequence that provides an equality between the output of a fault free sub-circuit 602 and the required output buffer 608.

For Function B when trying to trace back the inputs required to the primary input pins, success is met when the comparator 604 produces an equality between the desired output vector buffer 608 and the actual output of the fault free circuit configuration 602.

Referring now to FIG. 6C detailing Function C. This function determines values for some of the input pins, so that the remaining inputs may propagate to the output and allow the test to be observed. Function C traces the outputs of the sub-circuit to the output pins of the chip. In this case receivers of the outputs would be modeled by TGFS comparators under Function C.

A sequence of test vectors and output vectors from Function A, move next to each of the receivers of the output pins, (see FIG. 9), which shows interconnected sub-circuits.

In test generation the I/O/F unit 607, manages the transfer of the outputs from one sub-circuit into the input buffers 610, 611 of the receiver stages. Not all the pins need be common. Therefore the values of the rest of the input pins, which are not connected to the previous sub-circuit must still be determined.

The forward traversal follows an onion-like layer by layer analysis of the fault free sub-circuit 602 and the single fault sub-circuit 603. The operations management software has to transfer the value of the outputs of the fault free sub-circuit 602 and the single fault sub-circuit 603 to the input buffers 610, 611 (via the programmable interconnect system in FIG. 9). This process is continued all the way to the output pins with the objective of ensuring that there is a difference seen between the fault free sub-circuit 602 and the single fault sub-circuit 603.

At each stage, the test vector generator 601 drives the inputs through the entire solution set and determines input pin values, that allow the outputs of fault free sub-circuit 602 and the single fault sub-circuit 603 to be different. If this is not so then the faulty vector will not be observable. The multi-bit comparator 604 at each stage is used to test the difference.

The operation traces back the input pin values all the way to the primary inputs, using Function B. This operation continues stage by stage until it reaches the outputs of the main circuit. The entire sequence of operations is managed by the test generation and software system in FIG. 2. The majority of the execution and communication is done in hardware and there is little software interaction, allowing higher performance than a software only approach.

Referring now to FIG. 6D detailing Function D. This function determines the set up for fault simulation.

First, connect comparator sub-circuits as per FIG. 9. Then introduce a fault in only one of the single fault sub-circuits 603 (902) reserved for faulty models. If a fault specific test sequence is available, simulate the faults with specific test vectors from the test database 102B. If a test vector set is already provided, simulate all faults with all the test vectors and grade the test vectors for their effectiveness in flagging faults.

I/O/F Messaging Unit—Once the hardware comparator completes any of the above functions it sends a message via the interconnect shown in FIG. 9, to other sub-circuits and also request them to perform a function. Example: A comparator may complete Function A and request Function B from a driver sub-circuit and Function C from a receiver sub-circuit. If a function request comes in while a sub-circuit hardware comparator is busy it will be queued up and executed when it is free. The I/O/F unit is permanently enabled during Function D when fault simulation is being performed.

Function D works as a fault simulator system by interconnecting all the sub-circuits together as described and shown in FIG. 10. Then we model faults one-by-one, and grade test vectors for their coverage in detecting faults.

A test vector generator system 601 is able to count up from 0 to the maximum count possible, which for 'n' input pins would be $2^n$. Example of operation up to around 1 million for a 20 pin input system. It should be noted given the present speeds of programmable logic, a 20 Mhz implementation, would take approximately 0.05 seconds to run through a million vectors. Two other variations are possible for the vector generator, other than just a plain counter. We could use a LFSR (linear feedback shift register) that counts through the entire solution set in a random like count, or use a pseudo random generator. The advantage is that we may arrive at a solution input faster than just a plain counter.

Returning now to FIG. 6, a fault free sub-circuit configuration 602 is mapped into a programmable device. The fault free sub-circuit configuration 602 derives its inputs from an input buffer 610. The fault free sub-circuit configuration 602 then drives an external I/O/F interface unit 607, while being sampled by a multi-bit comparator 604.

The single fault sub-circuit configuration 603 is the same as the fault free sub-circuit configuration 602 except for the introduction of a single fault. This is required for determining the required input vector to observe the fault, and the fault simulation phase where faults are introduced one by one. The single fault sub-circuit 603 gets its inputs driven by a second input buffer 611. The single fault sub-circuit then drives an external I/O/F interface unit 607, while being sampled by a multi-bit comparator 604.

The input buffers 610, 611 are connected to the inputs of the fault free sub-circuit 602 and the single fault sub-circuit 603. The input buffers 610, 611 are also connected to the I/O/F unit 607 and provide a means for pre-setting the input values based on a previous driver sub-circuit output, such as for Function C of the TGFS Comparator Circuit. The test vector generator 601 drives the input buffers 610, 611 and generates all variable (not preset) values for the input buffers 610, 611.

A multi-bit comparator 604 performs comparisons between two outputs, for every set of input test vectors. The type of comparison and its success depends on the function performed by the comparator.

A successful test capture buffer 605 records successful matches produced by the multi-bit comparator 604. Multiple successful test vectors are recorded to allow for impossible situations. The successful test capture buffer 605 is for recording both the successful input values and the corresponding outputs of the fault free sub-circuit 602 and single fault sub-circuit 603. The successful test capture buffer 605 communicates with other sub-circuits via an I/O/F unit 607. Input vectors are recorded by reading from the test vector generator 601, output vectors are recorded by reading the values from the inputs of the multi-bit comparator 604.

The initialization and multi-state handler system 606 supplies initial voltage values to the device pins and memory elements for the fault free sub-circuit 602 and the single fault sub-circuit 603. The initialization system obtains its values from the design database 102A.

It should be noted that the all input and output pins as well as values of internal memory elements are accessible and we may read or write information on the state of the inputs/outputs/memory elements. More details on the operation of the initialization system are shown in greater detail in FIG. 8.

Two output vector buffers 608, 609 store the value of the output pins and in operation of Function B of the 'Input Discovery Circuit' to trace back required test vectors to the input buffers 610, 611 of the two sub-circuits 602, 603. The multi-bit comparator 604 compares the value of the bits in the output vector buffers 608, 609 to the outputs of the corresponding sub-circuits 602, 603 and signals the appropriate success condition. If function (B) is successful, output vector buffer 608 must record the same data as the fault free sub-circuit 602.

A fault creation system 613 to reconfigure the single fault sub-circuit 603 to include a new single fault. The test database 102B is used to keep track of faults tested and yet to be tested.

Input buffer 610 is used to transfer values from previous driver sub-circuits. The test vector generator 601 does not generate any values for signals which are known and specified by previous driver sub-circuits, as provided to it by the I/O/F unit 607. Input buffer 611 gets its values from the previous single fault sub-circuit 603, as provided to it by the I/O/F unit 607.

Referring to FIG. 7—I/O/F Unit. The I/O/F unit acts as the messaging unit as well as the function synchronizer for the different sub-circuit comparators. The I/O/F unit has several functions. These functions are:

(a) Enable input and output communications between the sub-circuit comparators using the interconnection scheme between different sub-circuits (see FIG. 9).

(b) Act as a function control enabling the appropriate function (A, B, C, D) to be performed by the sub-circuit comparator.

(c) Control the test vector generator 601 and commence the count.

(d) Enable operation of the initialization and multi-state handling system (see FIG. 8).

(e) Transmit the successful test vectors derived from Function A to other driver sub-circuits so that they in turn may use Function B of the hardware comparator to propagate the test vectors to the primary input pins of the design. Similarly output vectors of successful tests are communicated to inputs of receiver blocks for Function C and D. Thus each comparator executes independently and when done solving, passes necessary information to the next driver or receiver comparator and also passes the function to be performed.

(f) Receives test vectors and required functionality from other sub-circuits and if busy queues the request or executes the request.

The value of the input and output test vectors 701 of the good and faulty configurations are processed according to the current function 702 being performed by that sub-circuit, along with a fault id number for keeping track of which fault is being analyzed.

The input/output test vectors 703 and functionality/fault id requests 704 are queued in the I/O/F queue 706 if the current sub-circuit is busy. A receiver 705 makes reception of the above possible. The I/O/F request queue 706 serves as an in-box if the hardware comparator 700 is busy, and stores input/output test vectors 701, 703, 708 and function requests 704, 709 and fault ids 704A, 709A from other sub-circuit comparators. A transmitter 707 relays the output function requests once the hardware comparator 700 completes the current function.

Upon completion of the current function, output test vectors 708 and function/fault id requests 709 are forwarded to the appropriate sub-circuits. A status interpreter 710 senses if the function is complete, such as when the counter completes the entire count inside the hardware comparator or when the input or output pins are reached. The test vector values may now be added to the test database 102B against the fault id.

Refer FIG. 8—Initialization and Multi-State Handling System. This circuit is required for sequential logic circuits, for initialization and enforcing valid states, and avoid invalid states.

This function is required since unlike combinational logic, sequential logic circuits travel through a series of valid logic states, and should avoid certain invalid logic states, which may trap them. The TGFS comparator (FIG. 6) analyzes combinational circuits between each state transition, thus simplifying the analysis. This circuit will allow only valid state changes and prevent invalid state changes by reversing the change and skipping the vectors that produce invalid changes.

Initial values of logic states are downloaded from the computer's RAM 103. Information on valid and invalid states are downloaded from the design database 102A. A buffer of valid states 802 stores values of all the states, RAM 103 can be used for any overflow information. Another buffer of invalid states 803 stores all invalid state information, again any overflow can be handled by the computer RAM 103.

The initial or prior value of logic states 804 is derived from the design database 102A, and updated continually with information on actual value of logic states 805. The actual values of logic states 805 are derived by direct links to memory elements, such as flip-flops, registers, etc. A Write function 813 updates actual value states 805 to the prior value states 804. This process is triggered by each new test vector generated in the test vector generator system 601.

A comparator system 807 compares the values of the actual logic states 805 to the buffer of valid states 802. All the buffers are scanned and if there is equality with any one, success is declared and 811 the Write function is enabled to allow the Test vector generator system 810 to write to 812, the Successful test capture buffer. Next a signal is sent to 809, which is a Reset function to reset the test vector generator system to start the input count up from initial values. (example: All Zeros.) The comparator system also sends a signal to the RAM 103 to load the valid states into the buffer of valid states 802, values of which may be a function of the present state of the sub-circuit.

A Comparator system 808 compares the values of actual logic states 805 to the buffer of invalid states 803. Again all buffers are continually scanned for equality. If there is a match with any one, a reversal of logic states is done by enabling the write function 806 to allow the prior value of logic states 804 to write to the actual value of logic states 805. Once this is done a signal is sent to continue 814 the function, and allows the test vector generator system 810 to continue (i.e resume) counting up values for possible input test vectors. The comparator system also sends a signal to the RAM 103 to load the valid states into the buffer of invalid states 803, values of which may be a function of the present state of the sub-circuit.

Details of the algorithm are provided below.

Refer FIG. 9—Interconnected TGFS comparator Sub-Circuits. This diagram represents an alternate circuit to that illustrated in drawing 6. Here the fault free sub-circuit 901 and the single fault sub-circuit 902 are contained inside a TGFS comparator 903. A fault can be introduced singly or in parallel. There can be a number of single fault sub-circuits in parallel preprogrammed with different faults, thereby eliminating the set-up time to reconfigure each new configuration with a new fault.

A programmable interconnect 904 is shown between the fault free sub-circuit 901 and single fault sub-circuit 902 comparators. In small sub-circuits, where many comparators fit inside one programmable logic device (i.e. PLD, GPA), the programmable interconnect is programmed inside the device by reconfiguring the device. Where larger sub-circuits may take up an entire programmable device, the programmable interconnect between devices can be a vendor provided solution (e.g. ALTERA) where the interconnections are done on a board or MCM (multi-chip module) wherein the different programmable devices are placed and the interconnections are programmable by the user using software provided by the vendor.

The connections are dependent on the function being performed by the hardware comparator (FIG. 6).

For test generation when functions A, B, C are being performed the interconnect only conducts when the messaging unit also called the I/O/F unit (FIG. 7) enables a message as and when a comparator completes its function, and sends the message down the interconnect which is then received by I/O/F units of other sub-circuit hardware comparators, which may choose to read the data and execute the appropriate function or which may be queued up to be read and executed when the comparator is ready (after completing its current operation and after completing all previously queued messages).

For fault simulation (function D) the interconnect is fully connected to enable sub-circuits to communicate fully with each other, as per user's design.

Refer FIG. 10—Shows the flowchart for the operation of the fault simulation system. Perform 'Fault Simulation', refer the flowchart in FIG. 10. The objective here is to find out the effectiveness of test vectors generated so far i.e. find out what (%) percentage of faults are detected by these test vectors.

1. For a fault specified in the test database.
2. Model the above fault at the sub-circuit level and interconnect all sub-circuits, thereby creating 2 copies of the full circuit, a good machine and a faulty machine with fault as per step 1. Additional pre-programmed fault copies may also be created without connection for avoiding delays due to the reconfiguring of faults. The interconnection is shown in FIG. 9, and the I/O/F unit is continuously enabled to have all comparators working under Function D.
3. Retrieve specific input test vectors from 'test database' and apply to primary inputs of full circuit and observe the primary output pins. If there is a difference between the good and faulty circuit, mark the test as a success, else mark test as a failure. Keep count of successes and failures.
4. If you don't have specific test vectors as per step 3, apply all available test vectors to the good and faulty circuits and update test database with the specific test vectors that produce a successful test i.e. there is a difference between the good and faulty circuits. Keep track of successes and failures.
5. Repeat steps 1 to 4 for all other faults listed in the test database and finally report on the undetected faults and list the percentage of successes.

Refer FIG. 11—Shows a sample example circuit design, to use to explain the computation of test vectors and the fault simulation sequence. Parts 1 through 6 represent example sub-circuit blocks A through F.

Example of Test Vector Generation

1. Starting with a fault to test inside block C. Block C is modeled with the TGFS Comparator (FIG. 6).
2. The system determines a possible test vector or test vector sequence that uniquely flags the fault. The values at signals 1111, 1112 and 1113 represent the desired test vector. (Note: If it is pure combinational you will get just one vector, if it is sequential logic with multiple states you will get a test vector sequence that switches the block through a series of valid states. The comparator will ensure that we stay within the valid states.
3. The above desired test vector(s) at 1111, 1112, and 1113 are to be propagated backward through drivers A and B. The drivers are modeled using the TGFS Comparator and Function B. The signal values 1117–1121 are determined. When the system reaches the input pins of the design, it proceeds next to ensuring that the output vectors of Block C i.e. 1114, 1115 and 1116 are observable.
4. The value of the signal 1114 for the good machine of block C is passed on as input for the good machine model for block D. Similarly the output of the fault machine model for Block C is passed on as input to the fault machine model copy of block D. Similarly the good and fault machine output values for signal 1123 are held to the same value as the good and fault machine output values for signal 1111 input to block C), since it is the same connection.

The comparator system for block D is now exercised using Function C and the values for signal 1122 determined that will propagate a difference between the good and faulty machine outputs at Block D. Note that it is possible that signal 1125 reflects a difference between the good and faulty machines and signals 1123 and 1124 do not reflect any difference. This is okay since the fault is still detectable.

5. As we perform step 4 and find no possible solution for signal 1122, then we have to start again at step 2 and use a different test sequence.
6. The outputs of the good and faulty machines for E are compared and if they are not different then we have to return to step 2 and use a new test sequence.
7. Test vector outputs at 1123, 1124 and 1125 are now recorded in the test database along with the corresponding test vectors at the inputs 1117, 1118, 1119, 1110 and 1121 against the specific fault which was modeled inside C.
8. All above steps are simultaneously executed in parallel for other blocks, till all faults in the test database have been tested or declared untestable.

9. What makes this possible is a speed of resolving test vectors at each stage, estimated to be 0.05 seconds or less for a million vectors, for even multi-state operations which involve table look-up operations.

Example of Fault Simulation (Refer FIG. 11)

It can be seen that all TGFS comparator blocks are interconnected. Vendors provide solutions for hardware programmable interconnects. To model a fault in Block C, the fault is modeled using the faulty configuration and the good configuration is disconnected. The entire design is now simulated with user test vectors or with specific test vectors from the test database. Next the faulty machine output is now observed. The good machine configuration is now connected and the faulty machine configuration disconnected. The good machine output is now observed.

If the faulty machine output and the good machine output are different we can say that the fault in C has been discovered. The process is now repeated for all faults in all the blocks.

Using the description provided above, it is possible to understand how the invention is used.

Step 1—First, a user enters a design into a design entry system which either accepts schematics or uses behavioral language descriptions as input and uses logic synthesis to generate a lower level description (netlist of gates, flip-flops, registers etc), in a format appropriate for the programmable logic place and route system (see FIG. 2, 201—Circuit Design Entry System).

The design database must have the design connectivity and structure in terms of a gate level netlist, design initialization values, information on valid and invalid logic states for each sub-circuit in the design, and information on the timing behavior of control inputs for each sub-circuit.

Step 2—The above gate description is partitioned into sub-circuits, which can fit on to half of an individual FPGA or PLD device, and each has less than a manageable number of unknown input pins. E.G. 20 input pins. Twenty is chosen to keep the number of combinations around one million ($2^{20}$). Clocking Signals whose timing behavior is known would not be part of the 20 restricted set, since there is no requirement for assigning random values to them. A faster technology allows a change in the limit of 20 pins, a 25 input pin system requires around 33 million combinations and a 30 pin input pin system would require around 1 billion combinations. See FIG. 2, Part 202—Circuit Design Mapping System.

Step 3—A software utility can be run to scan the netlist of each sub-circuit and generate a fault dictionary. There are many commercial and nonprofit written tools available for this task. The fault dictionary may be collapsed, to eliminate faults derived from others. The results are to be written to the Test Database 102B. The objective is to use programmable logic to depict each of the faults and then generate appropriate test vectors to make the fault observable.

Step 4—Sub-circuit programmed into the programmable logic device, in the form of FIG. 6, which is termed as a TGFS comparator. The comparator system contains 2 copies of the sub-circuit, a good configuration and a single fault configuration.

All FPGA and PLD vendors provide development software for mapping circuit configurations onto programmable logic devices. FIG. 5 shows the different fault types and a fault creation system creates faults on the nodes listed in the test database (Step 3). The process of fault creation can be automated by a program that sequentially cycles through the nodes in the fault list and performs the re-programming. This is also part of the TGFS comparator FIG. 6, Part 613.

The TGFS comparator has 4 functions as previously described (Functions A, B, C, and D).

Step 5—Generation of test vectors. See FIG. 3. This step starts with a listing of all faults in a sub-circuit after fault collapsing. The fault list is a result of processing the design database and using existing industry algorithms to locate and collapse faults. A master fault list is updated into the test database. Next a specific fault is loaded into a sub-circuit block.

Using Function A, each fault loaded into a sub-circuit block generates the required test vectors. This involves applying all possible combinations to the input pins of the good and single fault configurations and examining the output for a difference. For example: The speed of operation at around 20 Mhz would be around 0.05 seconds, for checking 1 million possibilities. See FIG. 5.

Speeds for fault discovery are higher if a LFSR (linear feedback shift register counting) or some other pseudo random coverage technique is used. All possible solutions up to a limit that may be specified by the user are recorded in the test database 102B. Multiple solutions are required for cases where feedback loops prove a need to change the initial solutions. The forward and backward propagation do not wait for all solutions before beginning to solve for the next solution. This speeds up the process of input determination. Since the entire construction is an assembly of parallel machines (hardware comparators), both fault discovery and forward/backward propagation may process at the same time.

Once the input test vector is determined, the I/O/F unit in FIG. 7 broadcasts the test vector to all different drivers of the sub-circuit. The programmable interconnection of comparator circuits in FIG. 9 communicates the logic between the different comparators. The desired Function B is also communicated. Function B is loaded to each driver of the starting sub-circuit permitting determination of possible input vectors. By repeating this step backwards it is possible to traverse the input pins and describe the test vectors applied to the input pins of the main circuit design.

If an impossible result is determined, then return to the third step and take a different test vector and repeating all steps to determine a possible result. If a contention persists then it can be broken by comparing the strengths of the drivers and taking the value from the stronger driver. If contention cannot be broken then that "fault" cannot be detected. This means more design data is required. The test database is updated with the list of undetectable faults.

To observe the output vectors, propagate forward the test vectors using the I/O/F unit in FIG. 7, from the outputs of the sub-circuit under analysis, i.e., the outputs of the fault free and single fault sub-circuits are loaded as inputs for the receiver sub-circuit which are also fault free. The task is to propagate the difference between the good and faulty machines, by adjusting the values of the remaining inputs of receivers, which are driven by the original sub-circuit.

As the outputs propagate forward Initialize input pins for receivers that prevent the output differences from being observed. The initialization vectors have to be then backward propagated to the input pins. This is done by running the receiver hardware comparators under Function C, so that the output differences between the good machines and fault machines continues to be visible.

Repeat the propagate forward initialize input pins for all receivers in the forward path till the output of the circuit design is reached. The fault and correct test vector sequence are now fully visible.

If the tests involve a sequence then all above steps have to be repeated for each member(s) of the test sequence.

Finally the test database is updated with the input test sequences for each fault and the corresponding values for the outputs of the good configuration and the single fault configuration.

Step 6—Perform 'Fault Simulation', refer the flowchart in FIG. 10. The objective here is to find out the effectiveness of test vectors generated so far i.e. find out what (%) percentage of faults are detected by these test vectors.

1. For a fault specified in the test database.
2. Model the above fault at the sub-circuit level and interconnect all sub-circuits, thereby creating 2 copies of the full circuit, a good machine and a faulty machine with fault as per step 1. Additional pre-programmed fault copies may also be created without connection for avoiding delays due to the reconfiguring of faults. The interconnection is shown in FIG. 9, and the I/O/F unit is continuously enabled to have all comparators working under Function D.
3. Retrieve specific input test vectors from 'test database' and apply to primary inputs of full circuit and observe the primary output pins. If there is a difference between the good and faulty circuit, mark the test as a success, else mark test as a failure. Keep count of successes and failures.
4. If there are no specific test vectors as per step 3, apply all available test vectors to the good and faulty circuits and update test database with the specific test vectors that produce a successful test i.e. there is a difference between the good and faulty circuits. Keep track of successes and failures.
5. Repeat steps 1 to 4 for all other faults listed in the test database and finally report on the undetected faults and list the percentage of successes.

Functions performed by the 'Test Generation and Fault Simulation Software System', FIG. 2, part 202, 203.

1. Help the designer to partition his design into smaller analyzable sub-circuits.
2. Map the sub-circuits on to programmable logic circuits.
3. Manage the design and test databases, extract information from the design database such as connectivity to set up the programmable interconnect between the sub-circuits and extract information on valid and invalid states by pre-fetching the information from the design database into the appropriate RAM locations, setup look-up tables for each sub-circuit to work with. (as in FIG. 8, parts 802 and 803).
4. Pre-fetch fault information from test database into RAM (Random Access Memory) to improve performance, initialize the sub-circuits by presetting values for the test vector generator (FIG. 6, part 601) and commence the test generation analysis.
5. Manage the reprogramming of single-faults into one or more copies of each sub-circuit, on a periodic basis as the test generation process continues, and continue to cycle through steps 3, 4 and 5 till all faults have been analyzed for generating test vectors.
6. Global test vector sequence synchronization—The Test Generation and Fault Simulation software has the task of ensuring that 'convergent sub-circuits', i.e. sub-circuits whose outputs drive a common receiver should have the same length of test vector sequence. If one sequence is longer than the other the operations management system has to update the test database to ensure the sequences are of equal length. This is done by processing and updating the test database based on connectivity information from the design database.
7. For invoking fault simulation, the 'test generation and fault simulation software system', has to sequentially take one fault at one time, enable the fault to be set-up in the faulty machine of the corresponding hardware comparator and set up the sub-circuit interconnections as in FIG. 9. The specific test sequence that will flag the 'fault in question' have to be retrieved from the test database and applied to the inputs of the circuit for both good and faulty machine configurations. The output of the circuit has to be observed and checked to ensure that the good and faulty machine outputs show a difference. If yes we note that the test sequence is successful, if not the test sequence is not successful. The software system will then proceed to the simulate the next fault.

The final test coverage will be determined as:

Total successful tests/total faults a figure of 100% is possible provided the circuit designer has provided all information mentioned above in the description of the design database.

Performance Measure

No design is complete without an indication of the performance that can be achieved.

For Test Generation:

ftavg=average number of faults per sub-circuit in the design frest=average time to resolve each sub-circuit fault per valid logic state tls=average number of valid logic states per sub-circuit nstages=average number of sub-circuit stages, input to output propagation cdf=derating factor to account for collisions during parallel fault computations, under no collisions it will be 1.

ccmx=circuit complexity factor, which will account for circuits with large fanouts(receivers), fanins(driver blocks) and feedbacks. This would be equal to 1 for a simple cascade chain of sub-circuits.

then time for computing test vectors will be of the order of:

$$ccmx \times ftavg \times cdf \times (tls \times frest)^{nstages}$$

Example:

ftavg=sub-circuit with 5000 gates (after fault collapsing)

frest=0.05 sec, based on 20 Mhz for million vectors, for a 20 input pins sub-circuit tls=5 (based on an average number of states)

nstages=3 (based on a average number of propagating sub-circuits)

cdf=2 (assuming a 50% collision rate i.e 1 in 2 computations collides)

ccmx=4 (assuming average fanout of say 3, and including feedback) time for computing tests will be approximately=$4 \times 5000 \times 2 \times 0.05 \times 5^3$=69 hours Note—

(1) Above is only meant to give an idea of the order of computation (2) Note that this is a parallel computation, hence the total size of the circuit is not as important as to how it is divided, the length of stages for logic propagation and the number of logic states that have to be traversed.

(5) For combinational sections the speeds will be much higher, hence we must average out the computation times between sequential logic and combinational logic.

For Fault Simulation:

(a) If fault specific test generation has been done:

Total time for fault simulation=(total number of faults)×(average test vector sequence)×(propagation time).

At 5 MHz, and average test vector sequence of 5 with 100,000 faults, the time for fault simulation will be 0.1 seconds.

The main delay will be due to database access, which we assume has been pre-loaded into RAM occupying in the case above around 200 Mega Bytes for a circuit with 200 input/output pins.

(b) If user generated test vectors are to be fault simulated:

This is the worst case for fault simulation since the database of all vectors has to be simulated against every fault. Thus the time for fault simulation for the above example given 500,000 input vectors would be around 3 hours.

The examples shown above are for clarifying the computation processes. Actual time would be dependent on the actual design size and complexity.

It is apparent from this description that the present invention implements test generation and fault simulation. The present invention also will provide the benefits of high performance since it is based on an implementation at the hardware level using programmable logic circuits, some with speeds greater than 100 Mhz. The invention offers a solution for possible 100% test generation which has remained elusive in the past due to the slowness of software only approaches. The design is scalable allowing application from small designs to super-large designs. The apparatus and method are applicable for both combinational and sequential type of circuits which may involve a sequence of states. The apparatus and method includes the creation of a test database, which can subsequently make it easy to apply fault specific tests, thus speeding up fault simulation.

With the fast growth in the size of VLSI (Very Large Scale Integration), performance becomes a mandatory requirement for test generation and fault simulation. The invention proposed here will be critical for producing fault free electronic components and assemblies.

Many variations of the design for the apparatus and method are possible:

The computer in FIG. 1 is a general purpose processor as mentioned earlier and thus may have variations in its structure of the memory address bus, data bus and control bus, thus the corresponding programmable circuits board would need to have different types of adaptors.

The implementation of the test and design database would also have to be a function of the computer architecture and convenience in mapping from design to data, example—A network type database may be used, which often offers better performance for mapping electronic circuit descriptions, or a relational type database is easier to implement and available off the shelf from vendors, or an object type database which offers the highest convenience for mapping electronic circuit objects.

It should be noted that there are many variations for the programmable circuits. Vendors offer them under various names, such as PLD (programmable logic devices), CPLD (complex PLDS), FPGA (field programmable gate array) etc using various technologies such as CMOS, GAL etc and using various methods for reconfigurability and multi-device programmable interconnect variations.

Partitioning the design into sub-circuits is a critical process and offers many variations, for example one option is a vendor solution such as offered by vendors such as NEOCAD, VIEWLOGIC etc. Another option is to write a custom partitioner which may be programmable circuit device dependent.

The test vectors generated by the system may be generated under various formats depending on the test system used for circuit testing. For example IEDEC, BSDL, HSDL etc or some of the various types of formats accepted by tester system manufacturers and need to be supported.

The examples and specifications given above are for providing illustrations and should not be construed as limiting the scope of the invention.

The scope of invention should be determined by the appended claims and their legal equivalents, rather than by the examples given.

What is claimed as the invention is:

1. A programmable automatic test pattern generation and fault simulation (TGFS) apparatus comprising:

(a) a plurality of I/O/F messaging buses, (b) a plurality of data storage devices, (c) a plurality of data buffers, (d) a plurality of programmable logic devices, (e) a plurality of test vector generators, (f) a plurality of multi-bit comparators, Said I/O/F messaging buses serving as a memory means and time delay processor for, and located substantially between, said plurality of data storage devices, said plurality of data buffers, said plurality of programmable logic devices and said test vector generators.

2. The apparatus of claim 1 wherein said permanent data storage device further comprises a design data base of a circuit, and a test data base of said circuit.

3. The apparatus of claim 1 or 2 wherein said design data base further comprises information on said circuit design connectivity, said circuit initialization, said circuit control, said circuit behavior, and said circuit timing.

4. The apparatus of claim 1 or 2 wherein said test data base further comprises information on said test circuit related to a master list of faults, and recording of results of test generation stored specific to each of said faults.

5. The apparatus of claim 1 wherein said data buffers further comprises a plurality of look-up tables.

6. The apparatus of claim 1 wherein said test vector generators further comprises any random or non-random counter type.

7. The apparatus of claim 1 where in said plurality of programmable logic devices further comprises a plurality of field programmable gate arrays.

8. The apparatus of claim 1 or 7 further comprises said plurality of programmable logic devices being programmed with identical partitions of a plurality of sub-circuits of said circuit, said programmable logic devices being divided into a first group and a second group, said first group being a fault free sub-circuit group and said second group reserved for a single fault sub-circuits, where at least one fault free sub-circuit is connected in parallel to a plurality of single fault sub-circuits, each fault read from a test database.

9. The apparatus of claim 1 wherein said I/O/F messaging buses further comprises:

(a) a plurality of receiver circuits, (b) a plurality of transmitter circuits, (c) a plurality of data queues, (d) a plurality of function queues, (e) a plurality of status interpreters, where data and function instructions enter through said plurality of receiver circuits first, then to any combination of said plurality of data queues, said plurality of function queues or said plurality of status interpreters second, and said plurality of transmitter circuits third.

10. The apparatus of claim 1 or 9 wherein said I/O/F messaging buses further comprises:

(a) a means for directing test data and function instructions to and from said plurality of programmable logic devices, said test vector generators and said data storage devices, (b) a means for receiving test data and instructions on function to execute with said test data, said transmitter circuits being capable of transmitting test results and instructions on function to execute on said test results, (c) a means to delay processing of test data from said single fault sub-circuits and said fault free sub-circuits, where said function queues receive and buffer instructions on what function to perform with corresponding said test data, said status interpreter starts and stops execution on said test data, (d) a means for switching of function between said plurality of multi-bit comparators permitting each said multi-bit comparator to pass data and trigger other said PLDs to execute a new function, (e) a means to record values of said input and output test vectors along with the type of function being executed and a fault identifier, (f) a means to transmit said input and output vectors, functionality requests and fault identifiers to said plurality of multi-bit comparators, said multi-bit comparators performing analysis of each said functionality request, (g) means to receive messages from other said sub-circuits providing said input and said output test vectors, said functionality request and said fault identifier, (h) said plurality of data queues and said plurality of function queues, queue data and function instructions for execution by said multi-bit comparators, (i) status interpreter system tracks status of execution.

11. The apparatus of claim 1 further comprising a means for tracking valid and invalid states supplied from said design database, comparing said valid and invalid states with actual logic states within said test circuit, reversing said test vector generators to restore original valid states when states are found invalid, skipping invalid test vector, and proceeding to next test vector.

12. The apparatus of claim 1 further comprises a means for implementing a fault producing scheme used to configure a plurality of single fault sub-circuits connected in parallel to a plurality of fault free sub-circuits.

13. The apparatus of claim 1 further comprises a means to successfully determine input test sequences for discovering a fault inside said single fault sub-circuit for said circuit, by applying all possible input pin combinations for said circuit and identifying those input pin combinations that show a difference between said fault free sub-circuit and said single fault sub circuit and to save said input test sequences and corresponding output test vector sequences of said fault free sub circuit and of the single fault sub circuit to said test database.

14. The apparatus of claim 1 further comprises a means to act as fault simulation system by introducing one said fault, then connecting all said multi-bit comparators together that make up said circuit, such that all said fault free sub-circuits are connected together as per said design and one copy of said single fault sub-circuit are connected together, without any parallel connections between the inputs and outputs of each said fault free sub-circuit and said single fault sub-circuit and applying input test vectors to said circuit and observing the outputs of said fault free sub-circuits and said single fault sub-circuits, comparing outputs for differences, and updating said test data base.

15. A method of automatic test pattern generation for an electronic circuit comprising the steps of:

(a) dividing a netlist of a test circuit into partitions, (b) programming said partitions onto a plurality of TGFS apparatus, (c) generating test vectors for said partition using said TGFS apparatus to flag faults within each said partition, (d) propagating said test vectors to boundaries of said circuit through a plurality of I/O/F messaging buses, (e) converting said test vectors to primary circuit input test vectors by processing said test vectors via a plurality of said TGFS apparatus.

16. A method of fault simulation for an electronic circuit in a computer comprising:

(a) creating artificial faults (b) placing said faults in a plurality of programmable logic devices, (c) using a counter to input test vectors into said plurality of programmable logic devices, and capturing said input vectors and output vectors in a test vector buffer or a test database, (d) comparing said output signals to generate said test pattern, and (e) analyzing said test pattern for fault simulation.

17. The method of claim 16 wherein step (a) comprises the generation of artificial faults by simulating said artificial faults and recording said artificial faults in a test data base.

18. The method of claim 16 wherein step (b) comprises the programming of said artificial faults into said plurality of programmable logic devices, said plurality of programmable logic devices being divided into a first group and a second group, said artificial faults being programmed into said second group of programmable logic devices.

19. The method of claim 16 wherein step (c) comprises inputting said test vectors into said first group of programmable logic devices and said second group of programmable logic devices end obtaining output signals from said first group and said second group of programmable logic devices.

20. The method of claim 16 wherein step (d) comprises compiling said test data base of said output signals.

21. The method of claim 16 wherein step (e) comprises statistical analysis of said test pattern for fault simulation.

* * * * *